(12) United States Patent
Maeno et al.

(10) Patent No.: US 7,078,714 B2
(45) Date of Patent: Jul. 18, 2006

(54) ION IMPLANTING APPARATUS

(75) Inventors: Syuichi Maeno, Kyoto (JP); Masao Naito, Kyoto (JP); Yasunori Ando, Kyoto (JP); Hilton F. Glavish, Incline Village, NV (US)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 10/845,209

(22) Filed: May 14, 2004

(65) Prior Publication Data
US 2005/0253089 A1    Nov. 17, 2005

(51) Int. Cl.
*H01J 37/00*    (2006.01)

(52) U.S. Cl. ............... 250/492.21; 250/358; 250/398; 250/423 R; 250/397

(58) Field of Classification Search ........... 250/492.21, 250/358, 398, 423 R, 397
See application file for complete search history.

(56) References Cited

U.S. PATENT DOCUMENTS

| | | | |
|---|---|---|---|
| 5,350,926 A | 9/1994 | White et al. | |
| 5,389,793 A * | 2/1995 | Aitken et al. | 250/492.21 |
| 5,834,786 A | 11/1998 | White et al. | |
| 6,160,262 A * | 12/2000 | Aoki et al. | 250/492.21 |
| 6,555,831 B1 * | 4/2003 | Konishi et al. | 250/492.21 |

* cited by examiner

*Primary Examiner*—Nikita Wells
*Assistant Examiner*—Zia R. Hashmi
(74) *Attorney, Agent, or Firm*—Finnegan, Henderson, Farabow, Garrett & Dunner, L.L.P.

(57) ABSTRACT

The ion implanting apparatus according to this invention includes: an ion source for producing the ion beam 20 including desired ion species and being shaped in a sheet with a width longer than a narrow width of a substrate 82, a mass separating magnet 36 for selectively deriving the desired ion species by bending the ion beam in a direction perpendicular to a sheet face thereof, a separating slit 72 for selectively making the desired ion species pass through by cooperating with the mass separating magnet 36, and a substrate drive device 86 for reciprocatedly driving the substrate 82 in a direction substantially perpendicular to the sheet face 20s of the ion beam 20 within an irradiating area of the ion beam 20 which has passed through a separating slit 72.

18 Claims, 13 Drawing Sheets

ION IMPLANTING APPARATUS

BACKGROUND OF THE INVENTION

1. Technical Field

This invention relates to an ion implanting apparatus for performing ion implantation by irradiating a substrate such as a semiconductor substrate, a substrate for a flat panel, etc. (in other words, workpiece or a processed body. The same goes for the following description). More particularly, this invention relates to an ion implanting apparatus which is appropriately adaptable to up-sizing of the substrate (in other words, large-scaling. The same goes for the following description). Incidentally, the ion implanting apparatus defined herein includes an apparatus called an ion doping apparatus.

2. Background Art

An example of ion implanting apparatus capable of irradiating a substrate with an ion beam having a large width and parallelized is disclosed in JP-A-2000-505234 (page 14, line 14 to page 15, line 15, FIG. 5). This ion implanting apparatus has a structure in which a unidirectionally diverging fan-shaped ion beam extracted from a small-sized ion source is bent in a plane in parallel to the fan face through a mass separating magnet serving as a beam parallelizing magnet so that desired ion species thereof are selected (mass-separated) and parallerized to form an ion beam having a large width and parallelized, and the substrate is irradiated with the ion beam.

In the ion implanting apparatus, the mass resolution of the mass separating magnet is high in the outer periphery of an ion-beam deflecting region and low in the inner periphery thereof. This is due to the fact that since the ion beam is parallelized while being bent, the deflecting angle is larger on the outer periphery to increase the mass resolution. However, with an increase in the mass resolution, the ion species are strictly separated. The amount of the ion species obtained is therefore decreased. Thus, the beam current density of the ion beam derived from the mass separating magnet results in a non-uniform distribution that it is low when the ion-beam has passed the outer periphery and high when the ion-beam passed the inner periphery. Namely, the uniformity of the beam current density distribution in a width direction of the ion beam is deteriorated.

In the ion-implanting apparatus disclosed in JP-A-2000-505234 (page 14, line 14 to page 15, line 15, FIG. 5), it can be proposed to correct the non-uniformity of the beam current density distribution due to the above reason by local deflection of the ion beam by the use of a multi-polar ion lens provided on the upstream side of the mass-separating magnet (for example, the ion beam is deflected toward the region having a lower current density to increase the current density on the region). However, the non-uniformity of the beam current density distribution due to the above fact is so great that correction by the multi-polar ion lens has a limit.

Further, if the non-uniformity of the beam current density distribution is corrected by largely deflecting the ion beam by the multi-polar ion lens, owing to this deflection, another problem of deteriorating the parallelism in the width direction of the ion beam occurs.

The above problem becomes more serious when the width of the ion beam derived from the mass separating magnet is increased in order to dealing with the large-scaling the substrate (for example, the substrate having a narrow side width of about 600 mm or more).

Further, in the above conventional technique of increasing the width of the ion beam by the use of divergence of the ion beam derived from the ion source, the beam current density decreases with an increase in the width of the ion beam. So dealing with the large-scaling of the substrate leads to a reduction in the processing speed per a single substrate.

DISCLOSURE OF THE INVENTION

In view of the above circumstance, this invention mainly intends to provide an ion implanting apparatus capable of dealing with the large-scaling of a substrate while suppressing a reduction in the uniformity of a beam current density distribution in a width direction of an ion beam, deterioration in the parallelism of the ion beam and reduction in a substrate processing speed.

The ion implanting apparatus according to this invention is an ion implanting apparatus for transporting and projecting, an ion beam which has been produced by an ion source and is shaped into a sheet with a width longer than a narrow side width, while keeping the width relationship, characterized by comprising:

the ion source for producing the ion beam including desired ion species to be implanted into the substrate and being shaped into the sheet with the width relationship, the ion source having a plurality of filaments which are used for generating a plasma for the sheet-shaped ion beam and arranged in a width direction of the sheet-shaped ion beam;

one or more filament power supplies capable of controlling filament currents which flow through the respective filaments of the ion source, independently of one another;

a mass separating magnet for receiving the sheet-shaped ion beam generated by the ion source, and selectively deriving the desired ion species by bending the ion beam in a direction perpendicular to a sheet face thereof, the mass separating magnet having magnet poles which are disposed with an interval longer than the width of the ion beam;

a separating slit for receiving the sheet-shaped ion beam which has been derived from the mass separating magnet and selectively making the desired ion species pass through by cooperating with the mass separating magnet; and a substrate drive device having a holder for holding the substrate, and reciprocatedly driving the substrate on the holder in a direction intersecting with the sheet face of the ion beam within an irradiating area of the sheet-shaped ion beam which has passed through the separating slit.

In accordance with this ion implanting apparatus, the ion beam which has been produced by an ion source and is shaped into a sheet with a width longer than a narrow side width of the substrate is transported, while keeping the width relationship and its desired ion species are selected (i.e. mass-separated) by the mass separating magnet and separating slit. The substrate on the holder can be irradiated with the ion beam thus obtained. So the entire surface of the substrate can be ion-implanted in cooperation between the sheet-shaped ion beam having the above width relationship and the above reciprocated driving of the substrate by the substrate drive device.

Between the ion source and the mass separating slit, an electrostatic lens or a magnetic lens for uniformizing a beam current density distribution in the width direction of the sheet-shaped ion beam may be disposed.

Outside and inside magnetic poles of the mass separating magnet, first sub-magnetic poles and second sub-magnetic poles for parallelizing a magnetic field between the main magnetic poles may be disposed, respectively. The interval of at least one of both sub-magnetic poles may be variable.

A movable magnetic pole may be disposed on at least one of inlet and outlet of the magnetic poles of the mass separating magnet (main magnetic poles if the sub-magnetic poles are disposed).

Scanning electrodes may be disposed at a downstream side of the separating slit to reciprocatedly scan the whole sheet-shaped ion beam in a direction perpendicular to the sheet face.

A beam profile monitor may be disposed at an upstream side or downstream side of the substrate on the holder to measure the beam current density distribution in the width direction by receiving the sheet-shaped ion beam.

A controller may be disposed for uniformizing the beam current density distribution in the width direction of the sheet-shaped ion beam to be incident on the substrate by controlling the filament power supply, electrostatic lens direct current power supply for the electrostatic lens, magnetic lens direct current power supply for the magnetic lens, sub-magnetic pole drive device for the sub-magnetic poles or movable magnetic pole drive device for the movable magnetic pole based on the measuring information of the beam profile monitor.

In accordance with the first aspect of this invention, the ion beam which has been produced by an ion source and is shaped into a sheet with a width longer than a narrow side width of the substrate is transported, while keeping the width relationship. In addition, the mass separating magnet performs the mass separation by bending the ion beam not in the width direction but in the direction perpendicular to a sheet face thereof. For this reason, the ion beam which has been produced by the ion source and is shaped into a sheet, after mass-separated without deteriorating the uniformity and parallelism of the beam current density distribution in the width direction, can be incident on the substrate. Therefore, unlike the conventional technique, the first aspect of this invention does not lead to a variation in the mass resolution due to different positions where the ion beam is bent and non-uniformity of the beam current density distribution attendant thereon, and deterioration of the parallelism of the ion beam due to correcting the non-uniformity.

Further, the large-scaling of the substrate can be easily dealt with by producing from the ion source the ion beam shaped into a sheet with a width corresponding to a narrow side width of the substrate and transporting the ion beam produced. Thus, the large-scaling of the substrate can be dealt with while a reduction in the uniformity of a beam current density distribution in the width direction of the ion beam and deterioration in the parallelism of the ion beam being suppressed.

Further, since the ion source has the plurality of filaments described above and the filament currents flowing through the corresponding filaments can be controlled independently of one another, the sheet-shaped ion beam with improved uniformity of the beam current density distribution in the width direction can be easily produced.

Furthermore, since the sheet-shaped ion beam having the above width relationship is produced from the ion source and transported to the substrate while keeping the width relationship, unlike the conventional technique, reduction in the beam current density, which is due to increasing the width by the use of the divergence of the ion beam, does not occur. Namely, the large-scaling of the substrate can be easily dealt with by producing from the ion source the ion beam shaped into a sheet with a width corresponding to a narrow side width of the substrate and transporting the ion beam produced, thereby preventing the reduction in the beam current density. Thus, the large-scaling of the substrate can be dealt with without reducing the processing speed per a single substrate.

In accordance with the second aspect of this invention relative to the first aspect thereof, there is presented a further effect of further enhancing the uniformity of the ion beam by adjusting the beam current density distribution in the width direction of the sheet-shaped ion beam using the electrostatic lens.

In accordance with the third aspect of this invention relative to the second aspect thereof, since the beam emittance can be controlled by the electrostatic lens as described above, thereby smoothing the microscopic (fine) non-uniformity in the width direction of the beam current density distribution, there is presented a further effect of further enhancing the uniformity of the beam current density distribution in the width direction of the sheet-shaped ion beam.

In accordance with the fourth aspect of this invention relative to the first aspect thereof, there is presented a further effect of further enhancing the uniformity of the ion beam current distribution by adjusting the beam current density distribution in the width direction of the sheet-shaped ion beam using the magnetic lens.

In accordance with the fifth aspect of this invention relative to the fourth aspect thereof, since the beam emittance can be controlled by the electrostatic lens as described above, thereby smoothing the microscopic (fine) non-uniformity in the width direction of the beam current density distribution, there is presented a further effect of further enhancing the uniformity of the beam current density distribution in the width direction of the sheet-shaped ion beam.

In accordance with the sixth aspect of this invention relative to the first aspect thereof, since the magnetic field between the main magnetic poles can be parallelized by the magnetic field between the first sub-magnetic poles and that between the second sub-magnetic poles, occurrence of the Lorentz force in a direction along the sheet face of the ion beam can be suppressed, thereby suppressing convergence or divergence in the width direction of the ion beam. As a result, there is presented a further effect of further enhancing the parallelism in the width direction of the sheet-shaped ion beam, thereby further enhancing the uniformity in the width direction of the ion beam of the beam current density distribution.

In accordance with the seventh aspect of this invention relative to the sixth aspect thereof, there is presented a further effect of realizing the adjustment of further parallelizing the magnetic field between the main magnetic poles.

In accordance with the eighth aspect of this invention relative to the seventh aspect thereof, there is presented a further effect of facilitating the adjustment of further parallelizing the magnetic field between the main magnetic poles by the use of the sub-magnetic pole drive device.

In accordance with the ninth aspect of this invention relative to the first aspect thereof and the tenth aspect of this invention relative to the sixth aspect thereof, since the ion beam passing the vicinity of the movable magnetic pole can be converged or diverged through an edge focusing effect by adjusting the above angle, there is presented a further effect of compensating for the divergence of the ion beam due to the Coulomb repulsion acting on the width direction of the sheet-shaped ion beam to further enhance the parallelism of the ion beam, thereby further enhancing the uniformity in the width direction of the ion beam of the beam current density distribution.

In accordance with the eleventh aspect of this invention relative to the ninth aspect thereof, there is presented a further effect of facilitating the adjustment of the angle of the movable magnetic pole using the movable magnetic pole drive device.

In accordance with the twelfth aspect of this invention relative to the first aspect thereof, the thickness (which is also the width in the reciprocated driving direction of the substrate) of the ion beam, which is greatly decreased after the ion beam has passed the separating slit, can be increased. Where the thickness of the ion beam is very small, although there is a possibility of occurrence of the non-uniformity in the implanting quantity due to fluctuation in the reciprocated driving speed of the substrate or the current value of the ion beam, there is presented a further effect of alleviating this non-uniformity by increasing the thickness of the ion beam.

In accordance with the thirteenth aspect of this invention relative to the first aspect thereof, since the information measured by the beam profile monitor can be employed, there is presented a further effect of facilitating the adjustment of enhancing the uniformity or parallelism in the width direction of the ion beam of the beam current density distribution.

In accordance with the fourteenth aspect of this invention relative to the first aspect thereof, there is presented a further effect of enhancing the uniformity of the beam current density distribution in the width direction of the sheet-shaped ion beam to be incident on the substrate through automated control by feedback-controlling the filament current of the ion source by the use of the beam profile monitor and control device.

In accordance with the fifteenth aspect of this invention relative to the second aspect thereof, there is presented a further effect of enhancing the uniformity of the beam current density distribution in the width direction of the sheet-shaped ion beam to be incident on the substrate through automated control by feedback-controlling the electrostatic lens by the use of the beam profile monitor and control device.

In accordance with the sixteenth aspect of this invention relative to the fourth aspect thereof, there is presented a further effect of enhancing the uniformity of the beam current density distribution in the width direction of the sheet-shaped ion beam to be incident on the substrate through automated control by feedback-controlling the magnetic lens by the use of the beam profile monitor and control device.

In accordance with the seventeenth aspect of this invention relative to the eighth aspect thereof, there is presented a further effect of enhancing the parallelism in the width direction of the sheet-shaped ion beam to be incident on the substrate and enhancing the uniformity of the beam current density distribution in that direction through automated control by feedback-controlling the interval between the sub-magnetic poles of the mass separating magnet by the use of the beam profile monitor and control device.

In accordance with the eighteenth aspect of this invention relative to the eleventh aspect thereof, there is presented a further effect of enhancing the parallelism in the width direction of the sheet-shaped ion beam to be incident on the substrate and enhancing the uniformity of the beam current density distribution in that direction through automated control by feedback-controlling the angle of the movable magnetic pole of the mass separating magnet by the use of the beam profile monitor and control device.

BEST MODE FOR CARRYING OUT THE INVENTION

Figure 1:
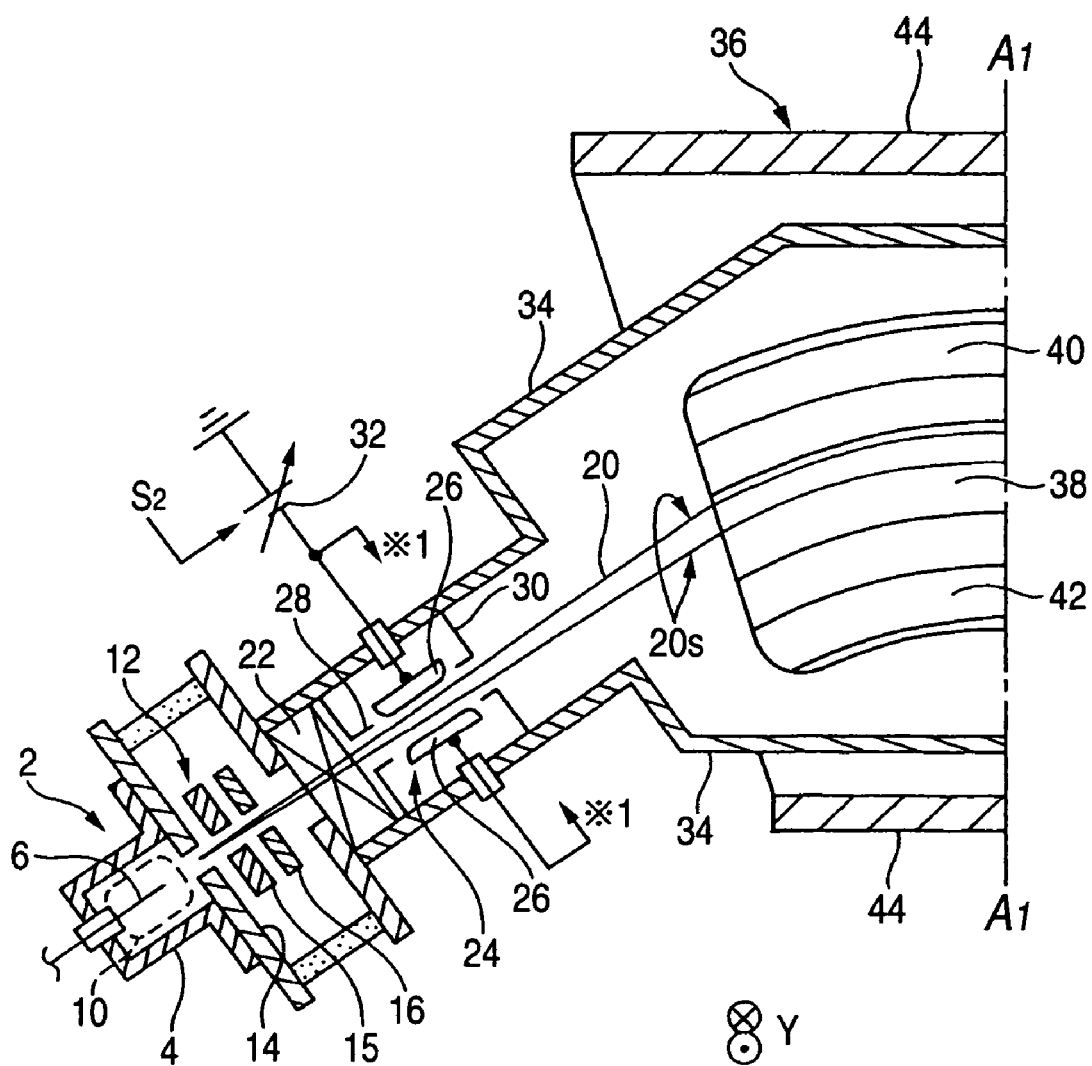
FIG. 1 is a transversal cross-sectional view showing a part of an embodiment of the ion implanting apparatus according to this invention and continuing to FIG. 2 at line A1—A1.
Figure 2:
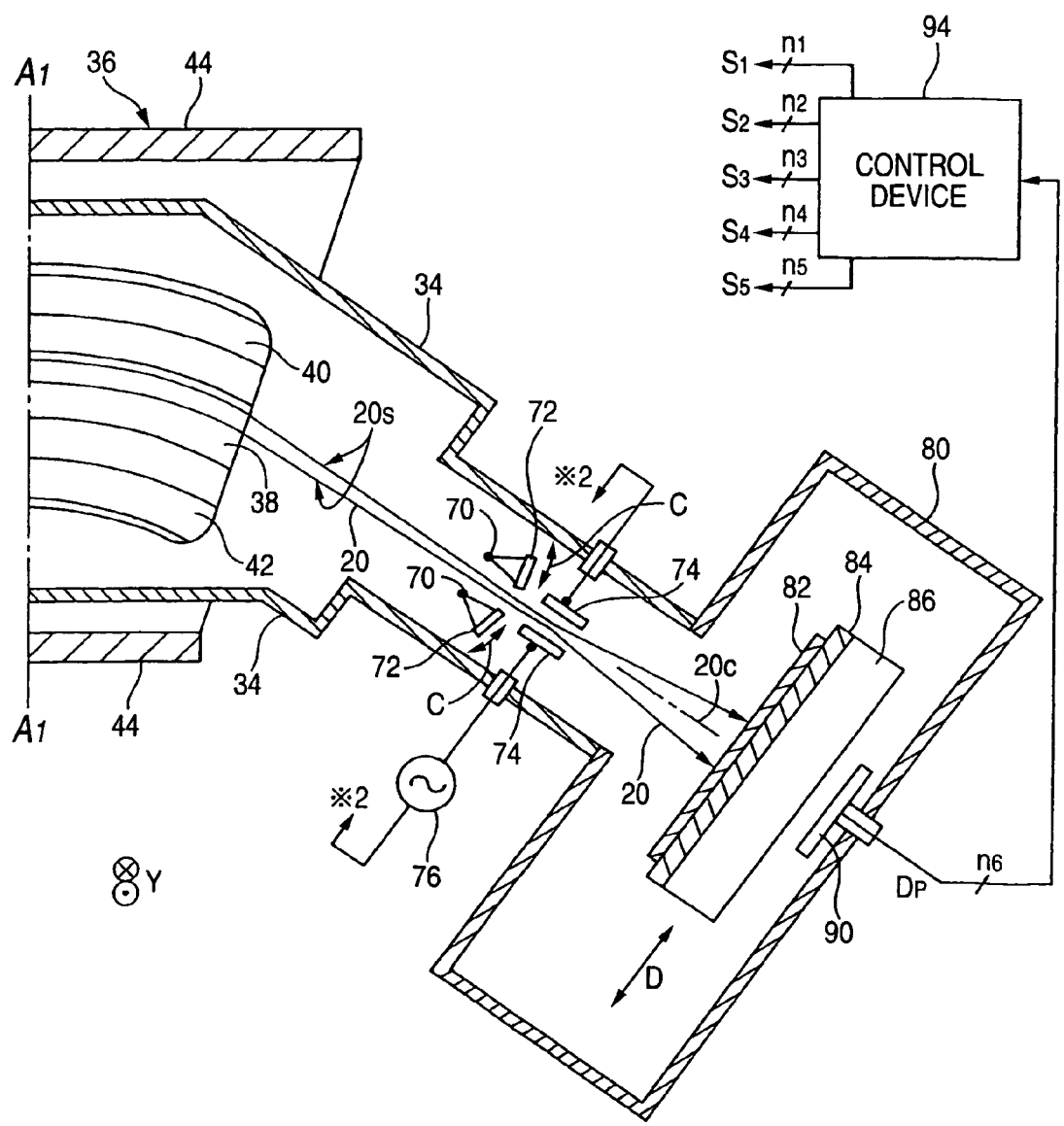
FIG. 2 is a transversal cross-sectional view showing the remaining part of an embodiment of the ion implanting apparatus according to this invention and continuing to FIG. 1 at line A1—A1.
Figure 3:
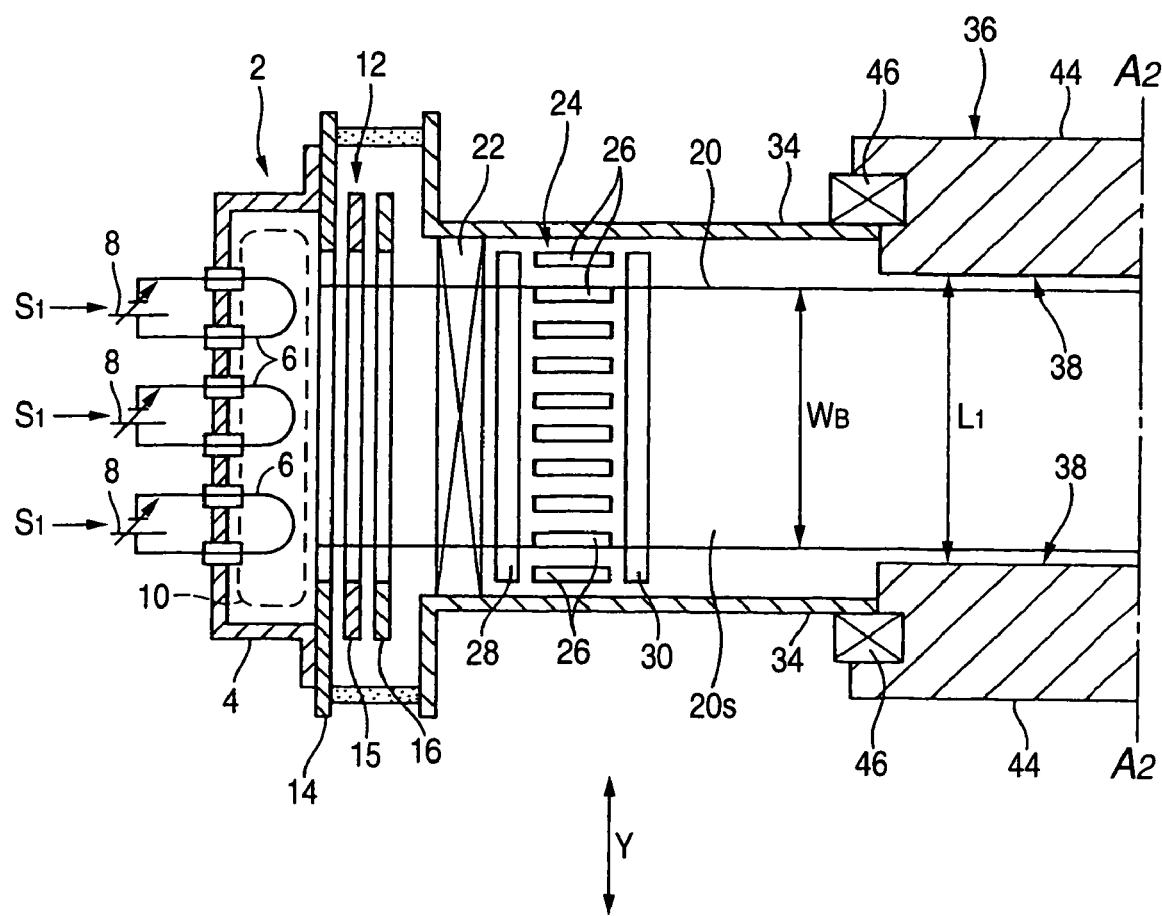
FIG. 3 is a longitudinal cross-sectional view showing a part of an embodiment of the ion implanting apparatus according to this invention as shown in FIGS. 1 and 2 and continuing to FIG. 4 at line A2—A2.
Figure 4:
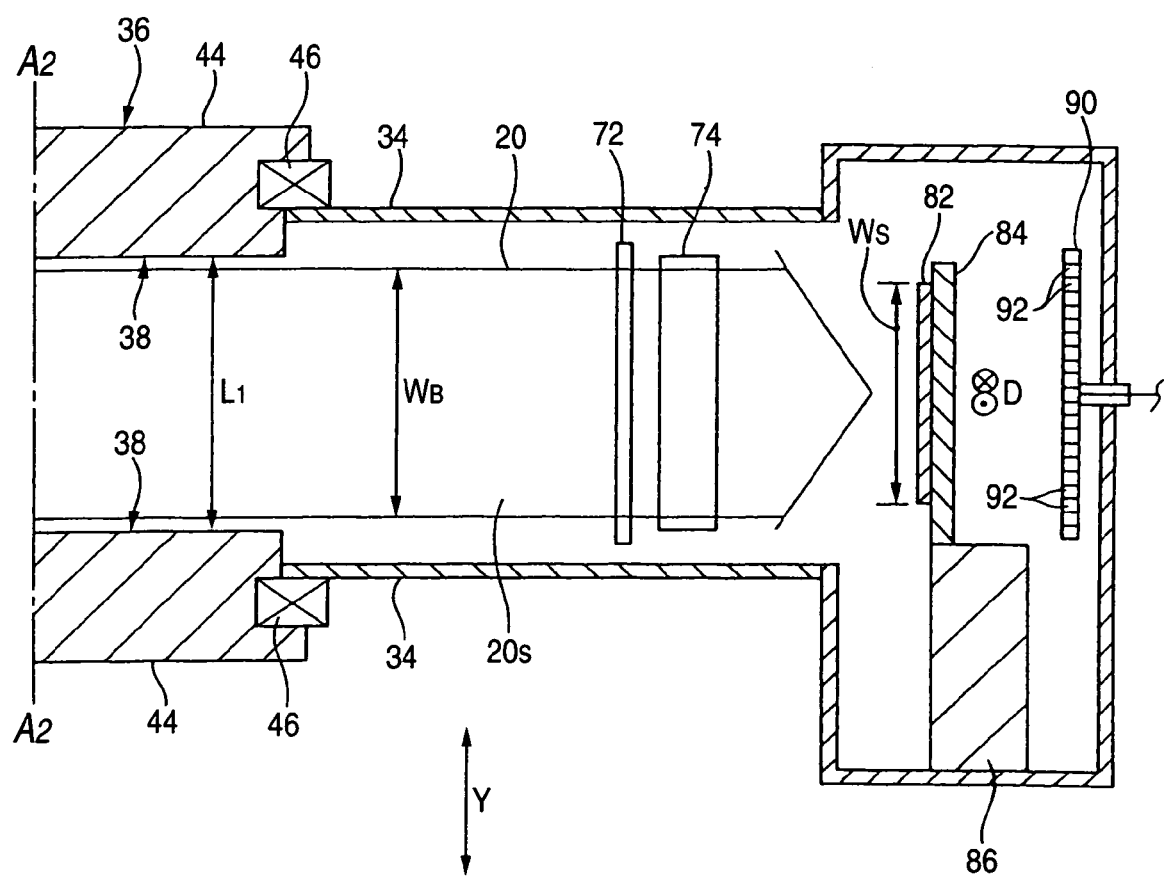
FIG. 4 is a longitudinal cross-sectional view showing the remaining part of an embodiment of the ion implanting apparatus according to this invention as shown in FIGS. 1 and 2 and continuing to FIG. 4 at line A2—A2.

FIG. 1 is a transversal cross-sectional view showing a part of an embodiment of the ion implanting apparatus according to this invention and continuing to FIG. 2 at line A1—A1. FIG. 2 is a transversal cross-sectional view showing the remaining part of an embodiment of the ion implanting apparatus according to this invention and continuing to FIG. 1 at line A1—A1. FIG. 3 is a longitudinal cross-sectional view showing a part of an embodiment of the ion implanting apparatus according to this invention as shown in FIGS. 1 and 2 and continuing to FIG. 4 at line A2—A2. FIG. 4 is a longitudinal cross-sectional view showing the remaining part of an embodiment of the ion implanting apparatus according to this invention as shown in FIGS. 1 and 2 and continuing to FIG. 4 at line A2—A2.

Figure 6:
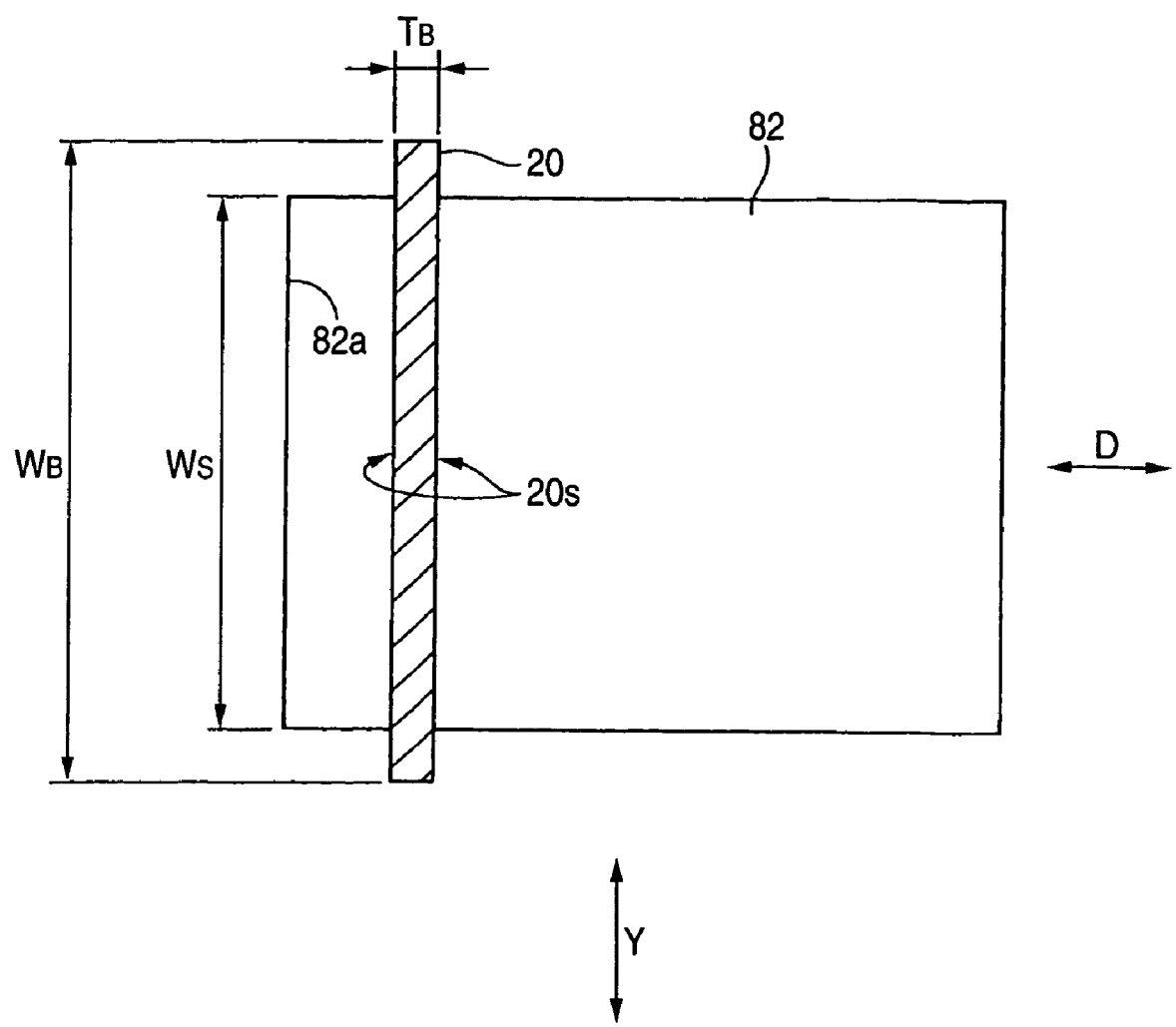
FIG. 6 is a front view showing an example of the relationship between the ion beam and a substrate.

This ion implanting apparatus, in principle, employs a square substrate 82 as shown in e.g. FIG. 6 as a processed body. The width of the narrow side 82a of the substrate 82 is referred to as a narrow side width WS. However, where the substrate 82 is a square or circle, the length of one side or the diameter may be handled like the narrow side width WS. Thus, the substrate 82 which is a square or circle can be also handled as the processed body. The substrate 82 may be e.g. a semiconductor substrate, a substrate for a flat panel display (e.g. glass substrate), etc.

This ion implanting apparatus is configured such that the ion beam 20 which has been produced by an ion source 2 and is shaped into a sheet with a width WB longer than the narrow side width WS of a substrate 82 (see also FIGS. 5 and 6) is transported and projected onto the substrate held by a holder 84 located within a processing room chamber 80 while keeping the width relationship past an electrostatic lens 24, a mass separating magnet 36, a separating slit 72, etc., thereby realizing ion-implantation for the substrate 82.

The path (beam line) of the ion beam 20 from the ion source 2 to the processing room chamber 80 is surrounded by a vacuum chamber 34. The vacuum chamber 34 is made of a non-magnetic material at the part at least within the mass separating magnet 36 and at the front and rear thereof. The interior of the ion source 2, vacuum chamber 34 and processing room chamber 80 is vacuum-evacuated by a vacuum evacuating device (not shown) when the ion implanting apparatus is operated. The vacuum chamber 34 and processing room chamber 80 are electrically connected to ground.

The ion source 2 produces the sheet-shaped ion beam 20 including desired ion species to be implanted into the substrate 82 and having the above width relationship. The expression "desired" can be translated into "predetermined" or "specific" (The same goes for the following description). The desired ion species can be specified by the mass and valence of an ion at issue.

Figure 5:
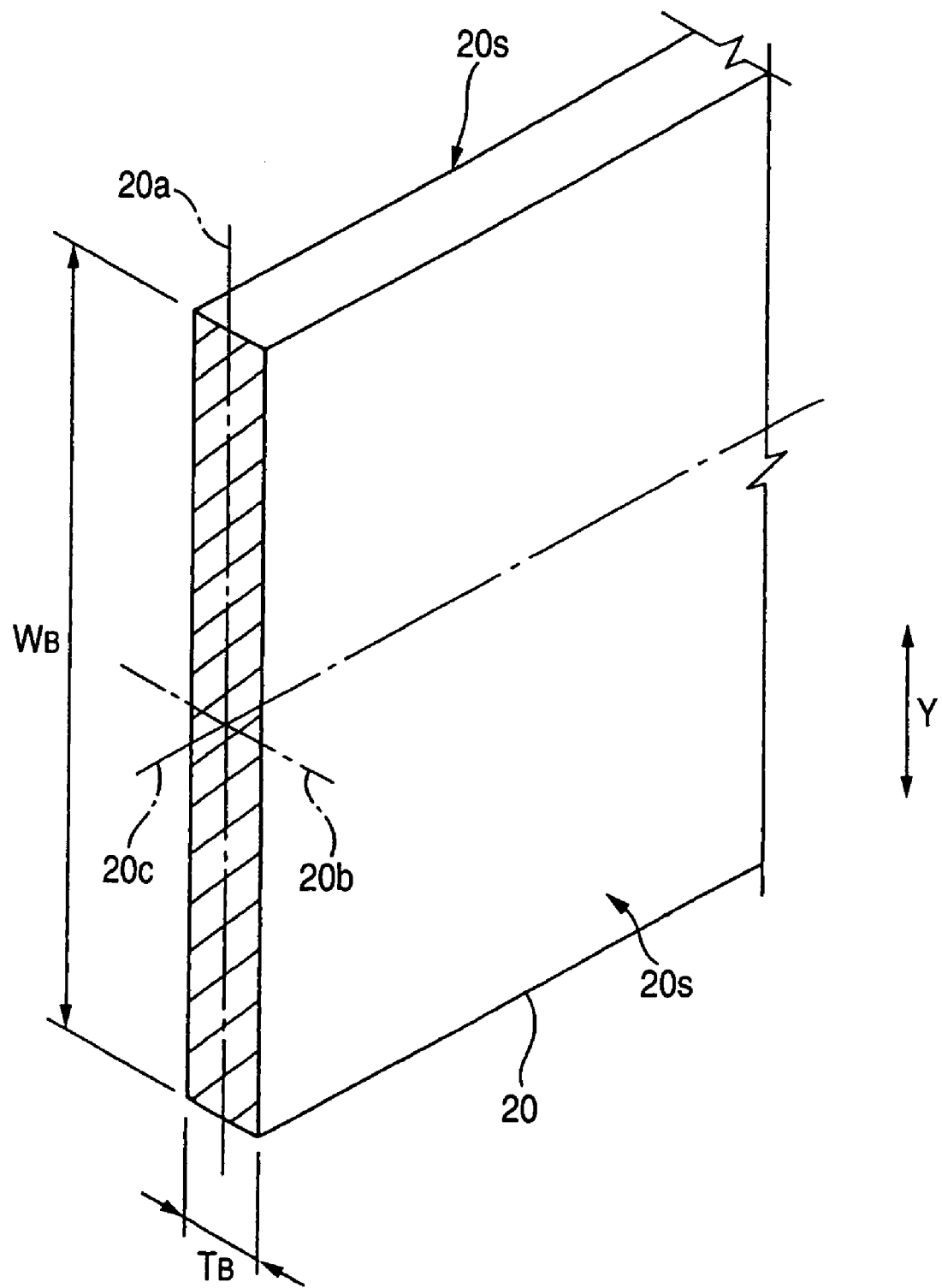
FIG. 5 is a perspective view showing a part of a simplified ion beam.

The sheet-shaped ion beam 20, whose one example is illustrated in a simplified manner in FIG. 5, has a slender and generally rectangular shape in a Y direction (e.g. vertical direction. The same goes for the following description) as a sectional shape vertical to the progressing direction. "Generally" means that the sectional shape of the ion beam 20 actually adopted is not completely rectangular as illustrated, and its outer margin is slightly blurred but not clearly delimited as drawn with line.

In this specification, the dimension in the direction along a long axis 20a of the rectangular section refers to width WB; the dimension thereof in the direction along a short axis 20b refers to thickness TB; the main face (face including the width WB) of the sheet-shaped ion beam refers to a sheet face 20s; and the center axis in the progressing direction of the ion beam 20 refers to a center axis 20c. Therefore, the width WB direction of the ion beam 20 is identical to the long axis 20a direction and the thickness TB direction is identical to the short axis 20b. Further, in this embodiment, the width WB direction of the ion beam 20 is identical to Y direction.

The sheet-shaped ion beam 20 is an ion beam having the thickness TB much shorter (e.g. about 1/10 to 1/100) than the width WB and may be called a belt-shaped ion beam.

In this embodiment, the ion source 2 is a "bucket-type ion source" having a rectangular box-type plasma production chamber 4 which is long in the width WB direction of the ion beam 20 and open in the one face. A raw material gas that serves as the material for the above desired ion species is introduced into the plasma production chamber 4.

Inside the plasma production chamber 4 are arranged a plurality of filaments 6 for a hot cathode at regular intervals in the width WB direction of the ion beam 20. The number of the filaments 6 should not be limited to three as shown in FIG. 3, but may be determined according to the width WB of the ion beam 20. For example, where the width WB is about 800 nm, the number of the filaments 6 may be 6 (six) or so.

A filament power supply is provided which is capable of controlling the filament currents to flow through the respective filaments 6 independently of one another. As an example, in this embodiment, as shown in FIG. 3, independent filament power supplies 8 are provided for the respective filaments 6. Namely, the filament power supplies 8 which are variable in their voltage are provided so as to correspond to the number of the filaments 6. However, without so doing, by unifying the plurality of power supplies, a single filament power supply may be used to control the filament currents which are to flow through the respective filaments independently of one another.

In such a configuration, since the ion source 2 has the plurality of filaments 6 as described above, and the filament currents to flow through the respective filaments 6 can be controlled independently of one another, the uniformity of the current density distribution in the width WB direction of the ion beam 20 of the plasma 10 can be improved, thereby facilitating production of the sheet-shaped ion beam 20 with an improved uniformity of the beam current density distribution in the width WB direction.

Namely, arc discharge is generated between each filament 6 and the plasma production chamber 4 to ionize the raw material, thereby producing, within the plasma production chamber 4, the plasma 10 with improved uniformity which is distributed long in the width WB direction of the ion beam 20.

In the vicinity of the opening of the plasma production chamber 4, a deriving electrode system 12 is provided which derives the sheet-shaped ion beam 20 by the action of an electric field from the plasma 10 and accelerates the ion beam to have desired energy. In this embodiment, the deriving electrode system 12 includes three electrodes 14 to 16. However, the number of the electrodes should not be limited to three. Each of the electrodes 14 to 16 may have a slit having a length larger than the width WB of the ion beam 20 as an ion deriving hole, or otherwise a plurality of (or many) pores arranged over the width WB of the ion beam 20 or longer. Although FIG. 3 shows the former case, the latter case is preferable. This is because the latter case can improve more greatly the uniformity in the WB direction of the ion beam 20 of the beam current density distribution.

In the configuration described above, the sheet-shaped ion beam 20 is derived from the ion source 2, more concretely from the plasma created within its plasma production chamber 4; the ion beam 20 including the desired ion species to be implanted into the substrate 82, having the above width relationship and providing improved beam current density distribution in the width WB direction.

Disposed at the downstream side of the ion source 2 (in other words, the proceeding direction of the ion beam 20. The same goes for the following description) is a mass separating magnet 36 for receiving the sheet-shaped ion beam 20 generated by the ion source 2, and deriving the desired ion species selected (i.e. mass-separated) by bending the ion beam in a direction perpendicular to a sheet face 20s thereof, the mass separating magnet 36 having magnet poles (concretely, magnetic poles 38) which are disposed with an interval L1 (i.e. L1>WB) longer than the width WB of the ion beam 20. As described above, since L1>WB, the ion beam 20 can pass through the mass separating magnet 36 while substantially keeping its parallelism. The details of the mass separating magnet 36 will be described later.

In the mass separating magnet 36, the ions constituting the ion beam 20 are given their own intrinsic orbit radius according their mass; disposed in the vicinity of the position at the downstream of the mass separating magnet 36 where the desired ion species are converged in the thickness TB direction of the ion beam 20 is a separating slit 72 for receiving the sheet-shaped ion beam 20 which has been derived from the mass separating magnet 36 and selectively making the desired ion species pass through in cooperation with the mass separating magnet 36. The length of the separating slit 72 in the width direction WB of the ion beam 20 is longer than the width WB as shown in FIG. 4.

In this embodiment, the separating slit 72 is made movable around center 70 as indicated by arrow C, thereby permitting the opening width (slit width) of the separating slit 72 to be mechanically varied. This further permits the resolution in the mass separation to be varied. For example, the resolution is increased with a decrease in the slit width, but the beam current density thus obtained is decreased. As for the phosphine ion (PHx$^+$) having an expansive molecular weight according to the number of coupled hydrogen atoms, the mass resolution (M/ΔM where M represents mass ΔM represents a difference) is preferably 5 or so. As for a phosphor ion (B$^+$) using a BF$_3$ gas as a raw gas to be supplied to the ion source 2, it is preferably 8 or so.

A substrate drive device 86 is provided within a processing room chamber 80 at the downstream side of the separating slit 72. The substrate drive device 86 has a holder 84 for holding the substrate 82, and reciprocatedly drives the substrate 82 on the holder 84 at a prescribed speed in a direction intersecting with the sheet face 20s of the ion beam 20 as indicated by arrow D within an irradiating area of the sheet-shaped ion beam which has passed through the separating slit 72 (FIG. 6). In this embodiment, the direction of reciprocated driving of the substrate 82 on the holder 84 is a direction substantially orthogonal to the sheet face 20s of the ion beam 20 (i.e. direction intersecting at a right angle or approximately right angle. The same goes for the following description). More concretely, referring to FIG. 2, the direction is a direction in which the center axis 20c of the ion beam is substantially orthogonal to the surface of the substrate 82. However, the substrate 80 may be reciprocatedly driven in a direction intersecting at an angle (e.g. 80 degree or so) slightly smaller than 90 degree or an angle (e.g. 100 degree or so) slightly larger than 90 degree.

In this embodiment, the substrate drive device 86 itself is reciprocated driven as indicated by arrow D along a rail not shown. Thus, the entire face of the substrate 82 can be irradiated with the ion beam 20 having desired ion species to be ion-implanted. The ion implantation can be adopted, for example, in a step in which a large number of thin film transistors (TFTs) are formed in a surface of the substrate 82 for use in a flat panel display.

Two substrate drive devices each being such as the substrate drive device 86 may be provided within the processing room chamber 80 in a beam proceeding direction. In this case, alternately using the two substrate drive device 86, the substrates held on the respective holders 84 are alternately ion-implanted. By doing so, the throughput can be improved.

In accordance with the ion implanting apparatus described above, the ion beam 20 which has been produced by the ion source 2 and is shaped into a sheet with a width WB longer than the narrow side width WS of the substrate 82 is transported, while keeping the width relationship (i.e. WB>WS). In addition, the mass separating magnet 36 performs the mass separation by bending the ion beam 20 not in the width direction WB but in the direction perpendicular to a sheet face 20s thereof. For this reason, the ion beam 20 which has been produced by the ion source 2 and is shaped into a sheet, after mass-separated without deteriorating the uniformity and parallelism of the beam current density in the width WB direction, can be incident on the substrate 82. Therefore, unlike the conventional technique, the ion implanting apparatus according to this embodiment does not lead to a variation in the mass resolution due to different positions where the ion beam is bent and non-uniformity of the beam current density distribution attendant thereon, and deterioration of the parallelism of the ion beam due to correcting the non-uniformity. Further, the large-scaling of the substrate 82 can be easily dealt with by producing, from the ion source 2, the ion beam 20 shaped into a sheet with a width WB corresponding to a narrow side width WS of the substrate 82 and transporting the ion beam produced. Thus, the large-scaling of the substrate 82 can be dealt with while while a reduction in the uniformity of a beam current density distribution in the width WB direction of the ion beam and deterioration in the parallelism of the ion beam 20 being suppressed. For example, the substrate 82 with the narrow side width WS of 800 mm, 1000 mm or more can be dealt with.

Further, the ion source 2 has the plurality of filaments 6 described above and the filament currents flowing through the corresponding filaments can be controlled independently of one another. This facilitates to improve the uniformity in the density distribution of the plasma 10 in the width WB direction of the ion beam thereby generating the sheet-shaped ion beam with improved uniformity of the beam current density distribution in the width WB direction.

Furthermore, since the sheet-shaped ion beam 20 having the above width relationship is produced from the ion source 2 and transported to the substrate 82 while keeping the width relationship, unlike the conventional technique, reduction in the beam current density, which is due to increasing the width by the use of the divergence of the ion beam, does not occur. Namely, the large-scaling of the substrate 82 can be easily dealt with by producing, from the ion source 2, the ion beam 20 shaped into a sheet with a width corresponding to a narrow side width WS of the substrate 82 and transporting the ion beam produced, thereby preventing the reduction in the beam current density. Thus, the large-scaling of the substrate 82 can be dealt with without reducing the processing speed per a single substrate.

The ion implanting apparatus according to this embodiment will be further explained. Between the ion source 2 and the electrostatic lens 24 (or magnetic lens 100), as in this embodiment, a gate valve 22 having a square opening is preferably provided. By doing so, maintenance of the ion source 2 can be done while keeping vacuum the interior of each of the vacuum chamber 34 and processing room chamber 80 at the downstream side of the gate valve, thereby greatly shortening the rebooting time of the ion implanting apparatus after the maintenance.

At the upstream side of the mass separating magnet 36, i.e. between the ion source 2 (gate valve 22 if it is provided) and the mass separating magnet 36, an electrostatic lens 24 is preferably arranged for uniformizing a beam current density distribution in the width WB direction of the sheet-shaped ion beam 20.

Figure 7:
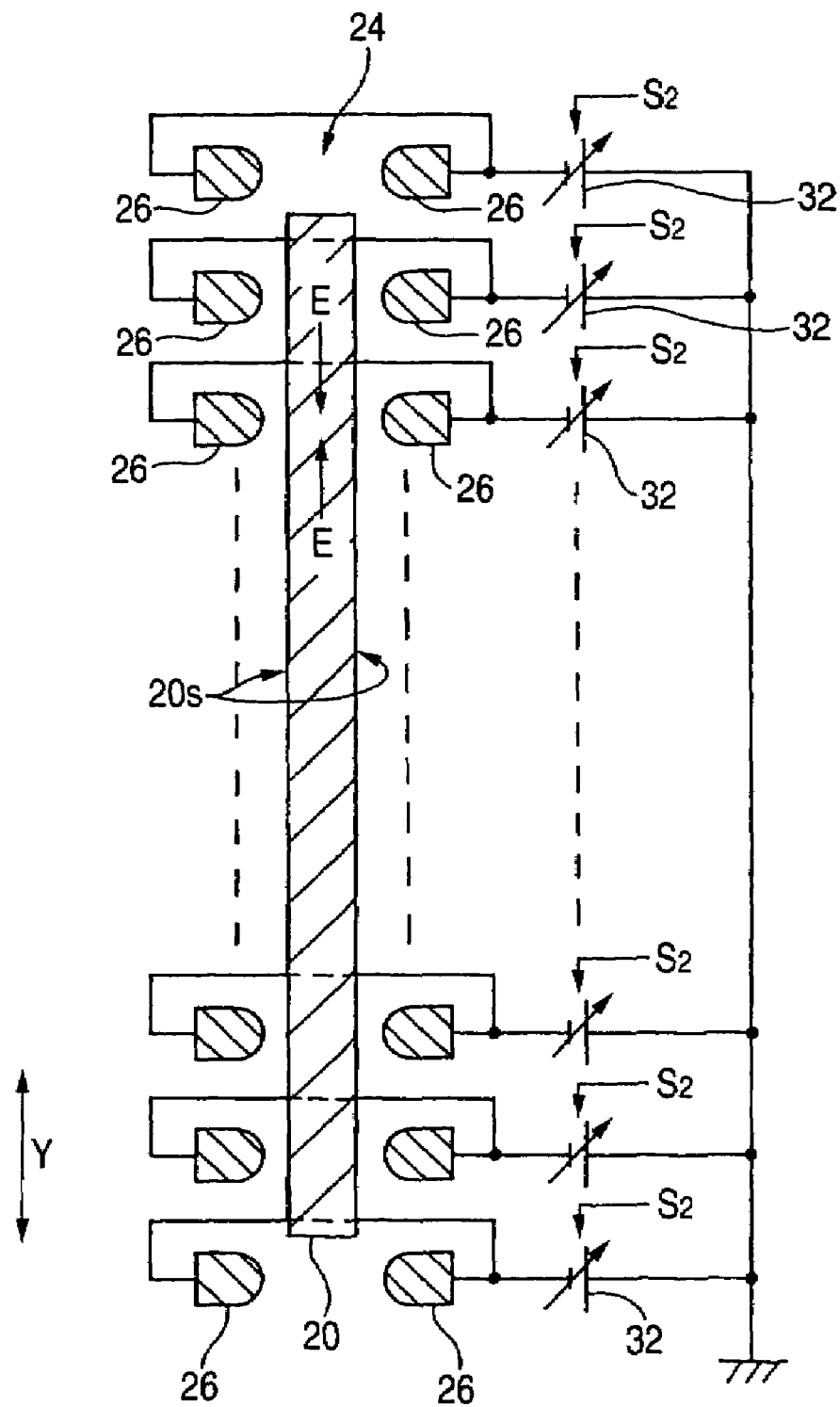
FIG. 7 is a view showing an example between an electrostatic lens and its power supply.

The electrostatic lens 24, also referring to FIG. 7, has a plurality of pairs (e.g. ten pairs) of electrodes arranged in multiple stages in a direction (in other words, in the width WB direction or Y direction; the same goes for the following description) along the sheet face and perpendicular to a beam traversing direction while sandwiching the sheet face 20s of the sheet-shaped ion beam 20. Each electrode 26 has a semi-cylindrical or semi-column shape. The pair of electrodes facing each other are electrically connected in parallel as shown in FIG. 7. Incidentally, in FIG. 7, for this parallel connection, it appears that the line for the parallel connection traverses the ion beam 20. However, such an illustration is adopted for simplicity of illustration. Actually, the line does not traverse the ion beam 20.

Between the pairs of electrodes at the respective stages and a reference potential portion (e.g. grounding potential portion), as an example of the electrostatic lens direct current power supplies which are independent of one another, as shown in FIG. 7, voltage-valuable electrostatic lens direct current power supplies 32 which are independent from each other are provided for the respective pairs of electrodes at the respective stages. Namely, the electrostatic lens direct current power supplies whose number corresponds to that of the pairs of electrodes are provided. However, without doing so and by collecting the plurality of electrodes into a single electrode, for example, using a single electrostatic lens direct current power supply, the D.C. voltages to be applied to the respective pairs of electrodes may be controlled independently of one another.

The D.C. voltage applied to the pair of electrode at each stage is preferably not a positive voltage but a negative voltage. The application of the negative voltage prevents the ion beam 20 and the electrons in the plasma existing in the vicinity thereof from being pulled in the electrodes 26. It can prevent extension of the divergence of the ion beam 20 which results through the space-charge effect from the pull-in of the electrons.

By adjusting the D.C. voltage applied to the pair of electrode at each stage to produce an electric field E (electric field E in FIG. 7 is one example) in the width WB direction of the ion beam 20, the ions constituting the ion beam 20 can be bent in the width WB direction according to the intensity of the electric field E.

Thus, by bending the ions in any region of the sheet-shaped ion beam 20 in the width WB direction using the electrostatic lens 24, the beam current density distribution in the width WB direction of the ion beam 20 can be adjusted to enhance the uniformity thereof.

Incidentally, the pairs of electrode arranged in multiple stages are not required to be arranged at regular intervals in the width direction of the ion beam 20. For example, for the purpose of suppressing the beam divergence due to the Coulomb repulsion, which strongly act between the ions in the vicinity of both ends in the width WB direction of the sheet-shaped ion beam 20, the above pairs of electrodes may be arranged so as to be more dense in the vicinity of both ends in the WB direction of the ion beam 20.

At both upstream and downstream sides of the electrodes constituting the electrostatic lens 24, as shown in FIGS. 1 and 3, shielding plates 28, 30 may be arranged. Both shielding plates 28, 30 are connected to the vacuum chamber 34 so that they are electrically grounded. Provision of the shielding plates 28, 30 prevents the electric field from the electrodes from leaking to the upstream and downstream sides of the electrostatic lens 24. As a result, it is possible to prevent a non-desired electric field from acting on the ion beam 20 in the vicinity of the upstream and downstream sides of the electrostatic lens 24.

Figure 10:
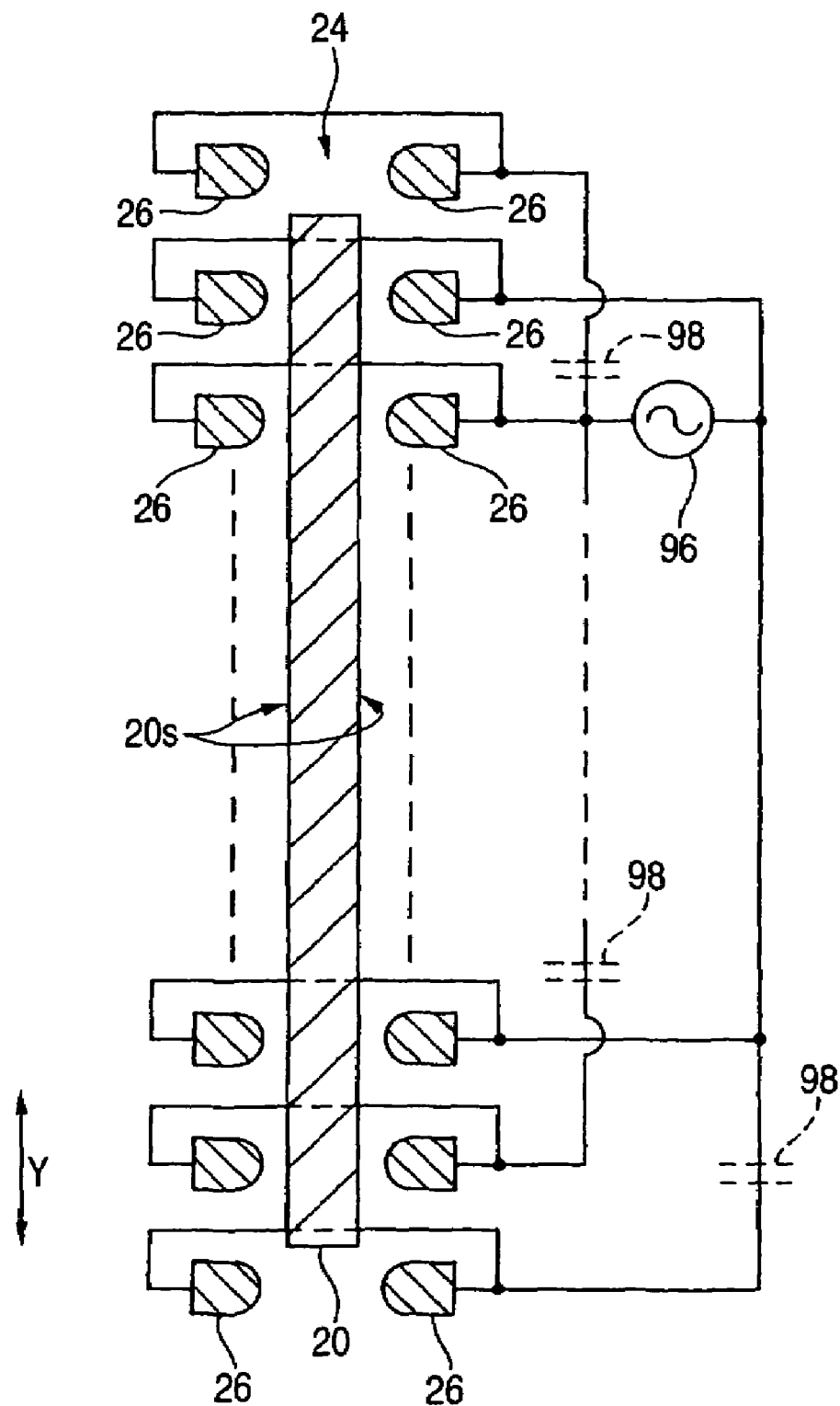
FIG. 10 is a view showing another example of the electrostatic lens and its power supply.

In place of the above electrostatic leans direct current power supply 32, as shown in FIG. 10, an electrostatic lens vibration power supply 96 may be provided for controlling a beam emittance in the WB direction of the sheet-shaped ion beam 20 by applying a vibration voltage between the odd numbers' pair of electrodes and the even numbers' pair of electrodes of the electrostatic lens 24 to vibrate the electric field intensity in the electrostatic lens 24 periodically. For example, the electrostatic lens vibration power supply 96 may bean A.C. power supply which provides the vibration voltage of an A.C. voltage. However, the A.C. voltage should not be limited to the voltage having a zero average value over one period.

Provision of the above electrostatic lens vibration power supply 96 permits the beam emittance to be controlled as described above by the electrostatic lens 24, thereby smoothing the microscopic (fine) non-uniformity of the beam current distribution in the width WB direction of the ion beam 20. So uniformity of the beam current density distribution in the width WB direction of the sheet-shaped ion beam 20 can be further enhanced.

The above electrostatic lens vibration power supply 96 may be provided in addition to the electrostatic direct current power supply. Namely, both power supplies 32 and 96 may be employed. In this case, as indicated by broken line in FIG. 10, capacitors 98 may be inserted in series in a circuit connecting the odd numbers' pairs of electrodes to prevent the odd numbers' pairs of electrodes from be connected in parallel in a D. C. manner. This applies to the odd numbers' pairs of electrodes. In this way, the D.C. voltage from the electrostatic lens D.C. power supply 32 and the vibration voltage from the electrostatic lens vibration power supply 96 can be supposedly applied to the respective pairs of electrodes.

If both power supplies 32 and 96 are employed as described above leads to employment of both smoothing the microscopic non-uniformity of the beam current density distribution in the width WB of the ion beam 20 by the electrostatic lens vibration power supply 96 and smoothing greater non-uniformity by the electrostatic lens direct current power supply 32. So uniformity of the beam current density distribution in the width WB direction of the sheet-shaped ion beam 20 can be further enhanced.

Further, uniformizing of the beam current density distribution through control of the filament current in the above ion source 2 is more macroscopic (i.e. uniformizes larger variation) than uniformizing by the above electrostatic lens 24. Thus, by employing both ways of uniformizing, owing to the multiplier effect of the macroscopic uniformizing and microscopic uniformizing, uniformity of the beam current density distribution can be made very preferable.

Figure 11:
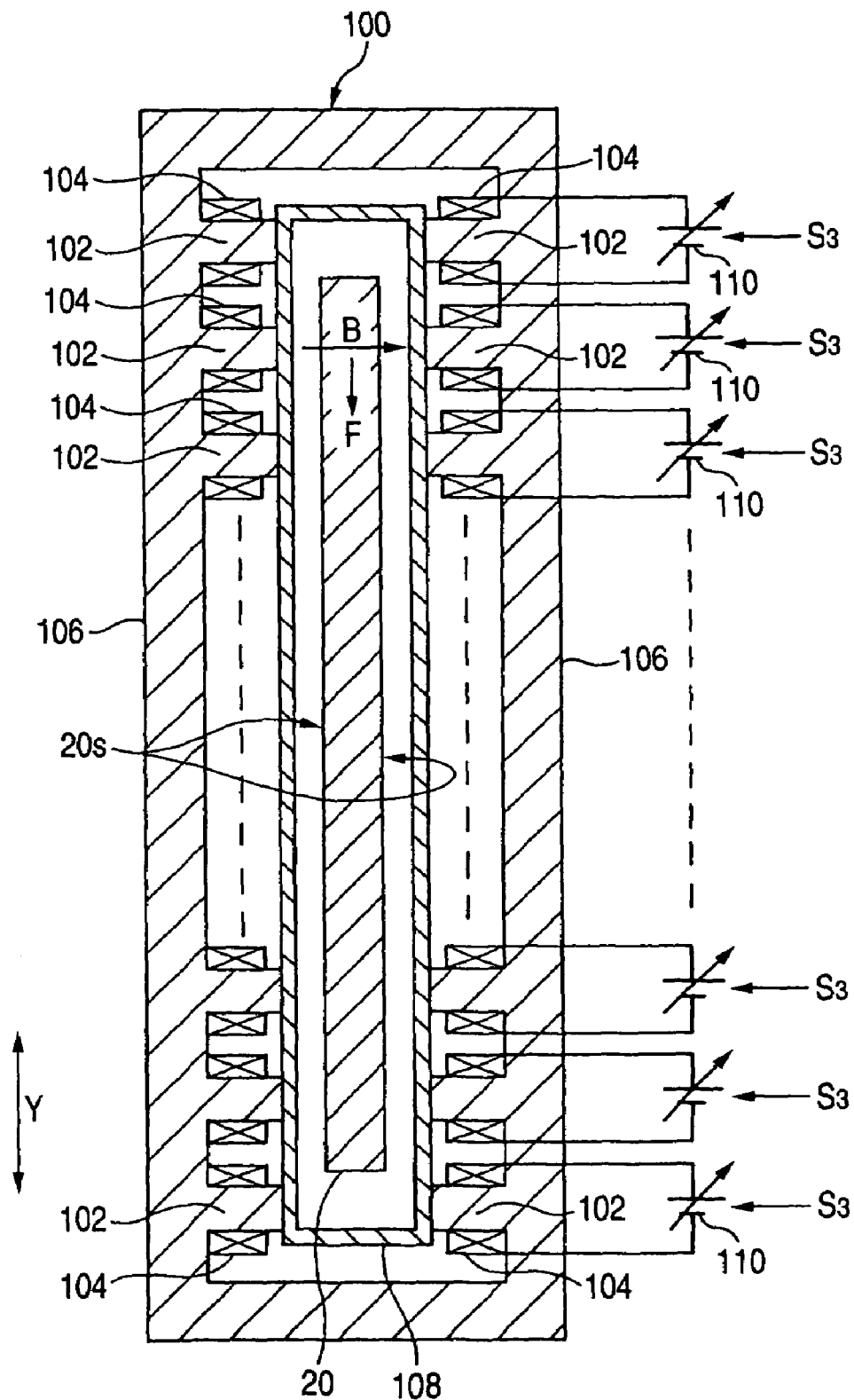
FIG. 11 is a view showing an example of a magnetic lens and its power supply.

In place of the above electrostatic lens 24, a magnetic lens 100 as shown in FIG. 11 may be provided. The magnetic lens 100 has a plurality of pairs (e.g. ten pairs) of magnetic poles 102 (magnetic pole pairs) facing each other while sandwiching the sheet face 20s of the sheet-shaped ion beam, arranged in multiple stages in a direction along the sheet face 20s and perpendicular to the beam traveling direction, and a plurality of excitation coils 104 for exciting the respective pairs of magnetic poles.

The magnetic poles 102 are magnetically connected in their rear by a yoke 106. The passage of the ion beam 20 at the front of the respective magnetic poles 102 is encircled by the vacuum chamber 108 made of non-magnetic material.

A plurality of magnetic lens direct current power supplies 110 are provided for passing direct currents through the respective excitation coils 104 for the respective pairs of magnetic poles. Namely, the magnetic lens direct current power supplies 110 whose number is equal to that of the pairs of magnetic poles are provided. The respective power supplies 110 are variable at least in their output current. In addition, the power supplies 110 are preferably power supplies with both polarities in which the direction of their output current is reversible.

Figure 12:
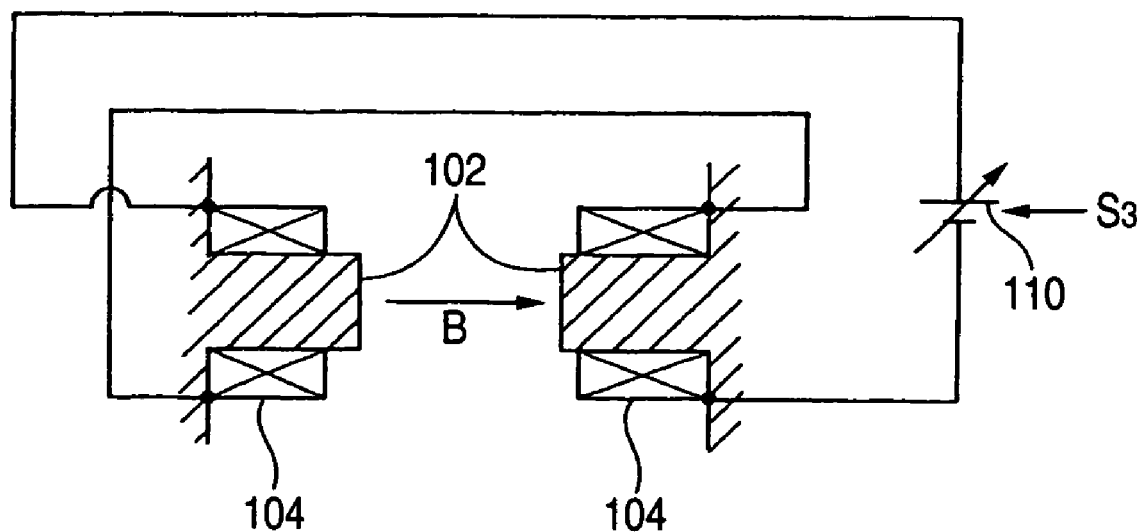
FIG. 12 is a view showing a concreter example of the connection between each exciting coil and each power supply in FIG. 11.

Although the wiring is simplified in FIG. 11, the excitation coils 104 wound around the two magnetic poles 102 constituting the pair are connected to the corresponding magnetic lens direct current power supply 110 in such a manner that they are connected in series with each other so as to produce the magnetic field B in the same direction as shown in FIG. 12. This applies to the case described later where the excitation coils 104 are connected to the magnetic lens vibration power supply 112.

By adjusting the direct current to flow through the excitation coils 104 of the pair of magnetic poles at each stage so that the magnetic field B to be generated in the pair of magnetic poles at each stage is adjusted to adjust the Lorentz force F acting in the width WB direction (an example of the magnetic field B and Lorentz force F is shown in FIG. 11), the ions in the ion beam 20 can be bent in the width WB direction.

Thus, by bending the ions in any region of the sheet-shaped ion beam 20 in the width WB direction using the magnetic lens 100, the beam current density distribution in the width WB direction of the ion beam 20 can be adjusted to enhance the uniformity thereof.

As in the case of the pairs of electrodes of the electrostatic lens 24, the pairs of magnetic poles arranged in multiple stages are not required to be arranged at regular intervals in the width direction of the ion beam 20.

Figure 13:
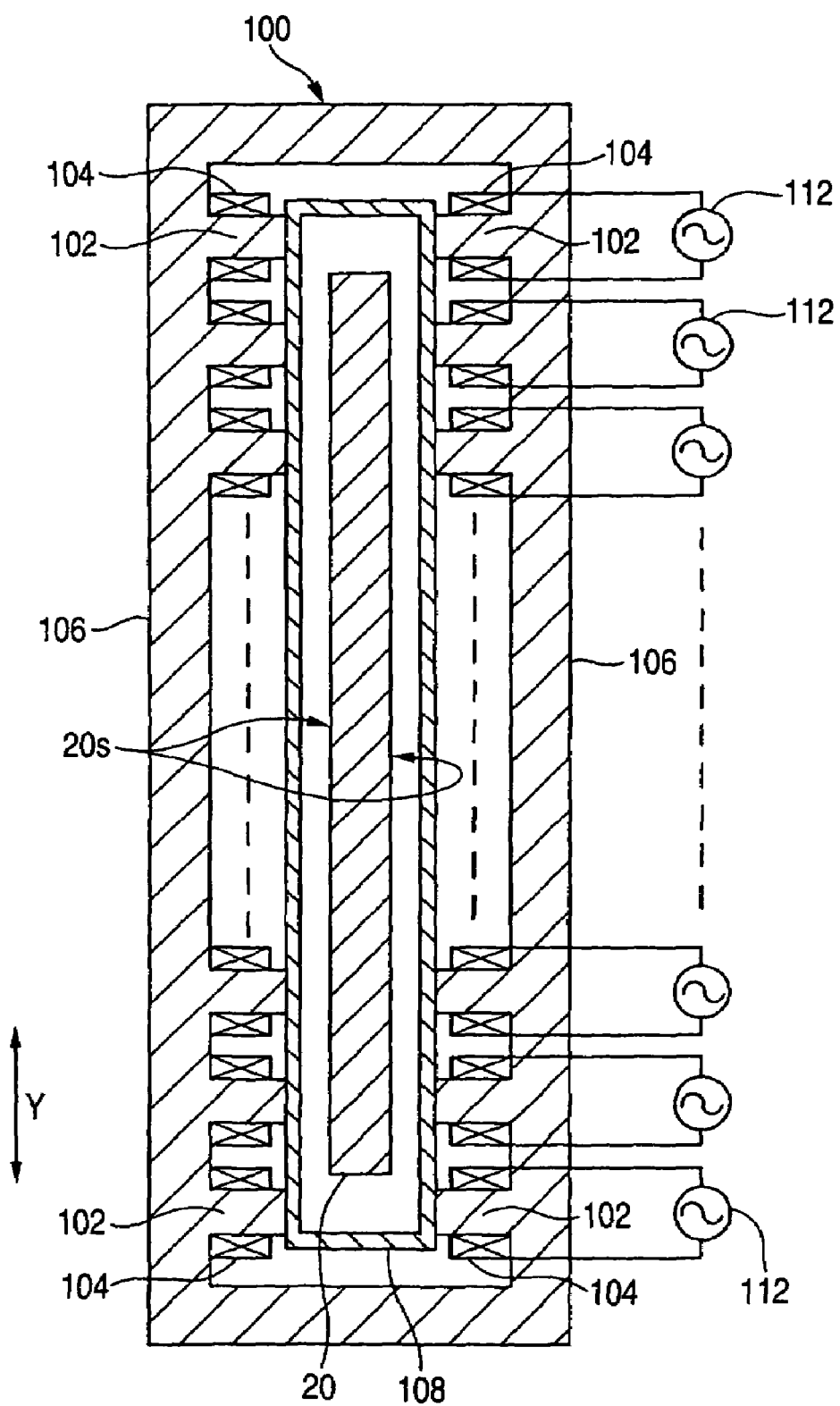
FIG. 13 is a view showing another example of the magnetic lens and its power supply.

In place of the above magnetic leans direct current power supply 32, as shown in FIG. 13, a plurality of magnetic lens vibration power supplies 112 may be provided for controlling a beam emittance in the WB direction of the sheet-shaped ion beam 20 by passing vibration currents through the respective excitation coils 104 of the magnetic lens 100 to vibrate the magnetic field intensity in the magnetic lens 100 periodically. For example, the magnetic lens vibration power supply 112 may be an A.C. power supply which provides the vibration current of an A.C. current. However, the A.C. current should not be limited to the voltage having a zero average value over one period.

Provision of the above magnetic lens vibration power supply 112 permits the beam emittance to be controlled as described above by the magnetic lens 100, thereby smoothing the microscopic (fine) non-uniformity of the beam current distribution in the width WB direction of the ion beam 20. So uniformity of the beam current density distribution in the width WB direction of the sheet-shaped ion beam 20 can be further enhanced.

The above magnetic lens vibration power supply 112 may be provided in addition to the magnetic lens direct current power supply 110. In this case, each electrostatic direct current power supply 110 and each magnetic lens vibration power supply 112 may be connected in series with each other so that the vibration voltage from the latter is superposed on the direct current from the former.

If both power supplies 110 and 112 are employed as described above leads to employment of both smoothing the microscopic non-uniformity of the beam current density distribution in the width WB of the ion beam 20 by the magnetic lens vibration power supply 112 and smoothing greater non-uniformity by the magnetic lens direct current power supply 110. So uniformity of the beam current density distribution in the width WB direction of the sheet-shaped ion beam 20 can be further enhanced.

The electrostatic lens 24 or magnetic lens 100 may be provided between the ion source 2 and the separating slit 7. Namely, it may be provided at the downstream side of the mass separating magnet 36 in place of the upstream side thereof. More specifically, it may be provided between the mass separating magnet 36 and the separating slit 72. However, even when the ion beam 20 is given a deflecting force by applying the electric field or magnetic field to the ion beam 20 using the electrostatic lens 24 or magnetic lens 100, in order that the ion beam deflects over a predetermined distance, a certain distance is required. In order to set this distance at a large value before the ion beam 20 is incident on the substrate 82, the electrostatic lens 24 or magnetic lens 100 is preferably provided at the upstream side of the mass separating magnet 36.

Since the interval L1 between the magnetic poles is wider than the width WB of the ion beam 20 as described above, in order to improve the parallelism of the magnetic field between the magnetic poles (parallelism in the thickness TB direction of the ion beam 20; the same goes for the following description) without greatly increasing the width between the magnetic poles (the width in the thickness TB direction of the ion beam 20; the same goes for the following description), as in this embodiment, the mass separating magnet 36 preferably includes the main magnetic poles 38, first sub-magnetic poles 40 and second sub-magnetic poles 42.

Figure 8:
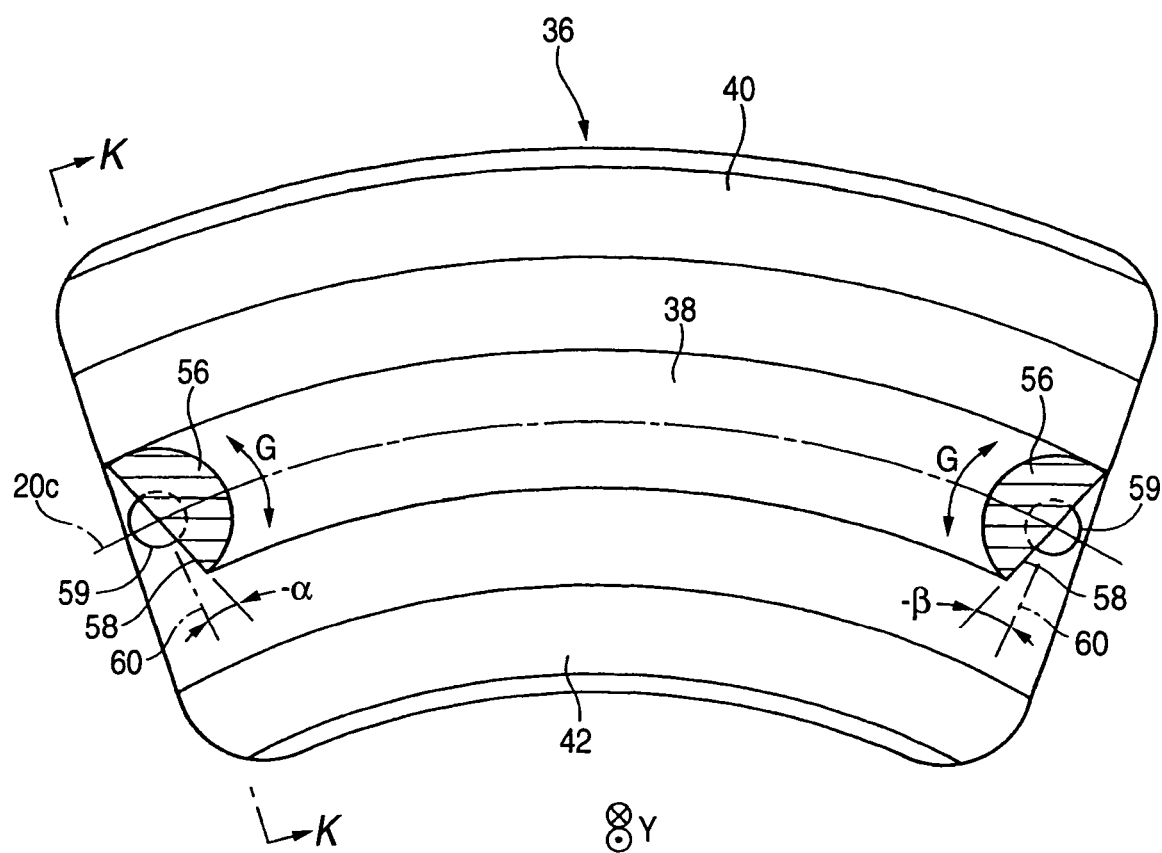
FIG. 8 is a plan view of another example of a mass separating magnet with an enlarged magnetic pole portion, which corresponds to the magnetic pole portion in FIGS. 1 and 2.
Figure 9:
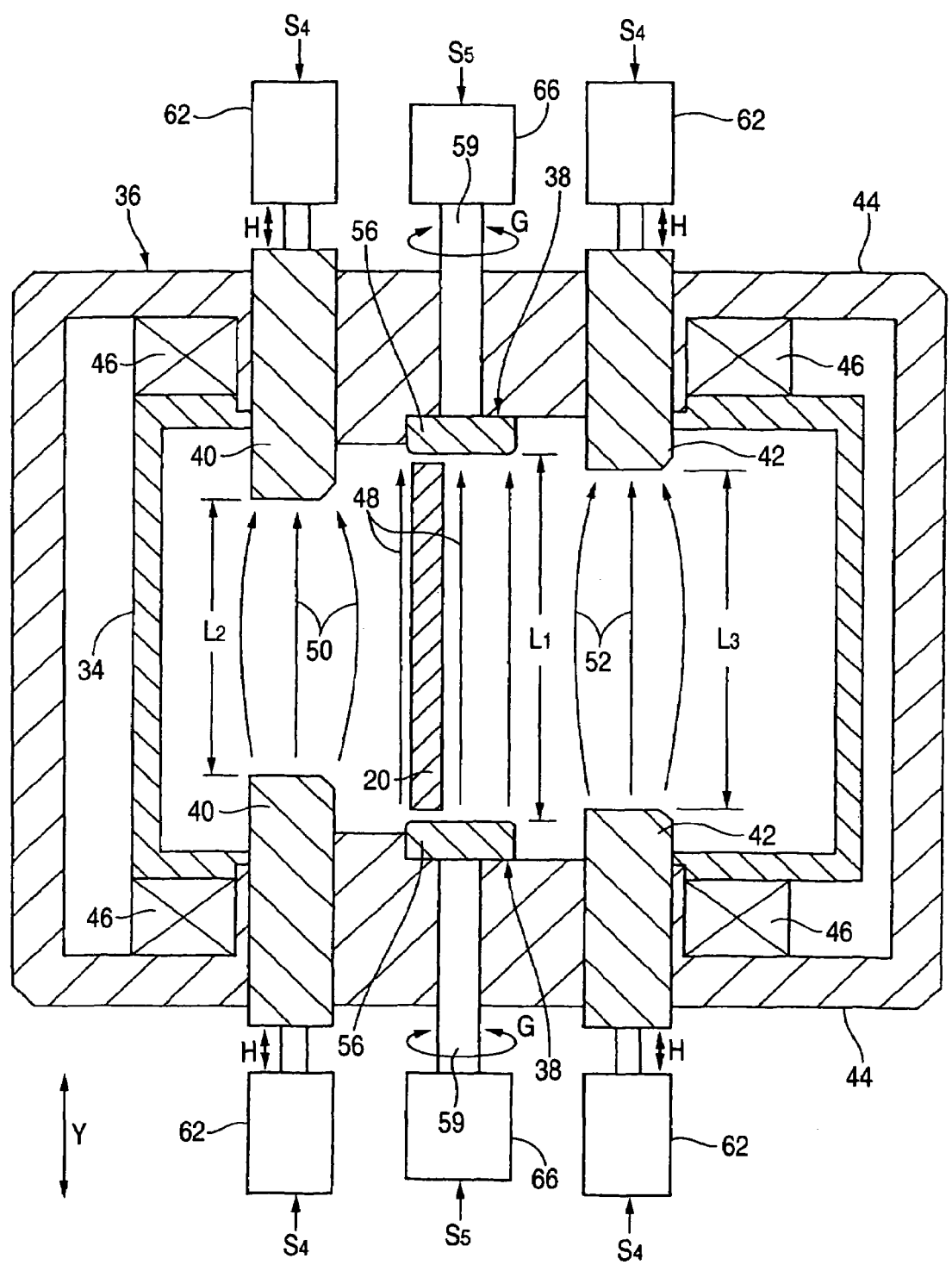
FIG. 9 is a longitudinal cross-sectional view of a further example of the mass separating magnet, which roughly corresponds to the section taken in line K—K in FIG. 8.

Specifically, also referring to FIGS. 8 and 9, the mass separating magnet includes a pair of main magnetic poles 38 facing each other with an interval L1 longer than the width WB of the sheet-shaped ion beam 20, through which the sheet-shaped ion beam 20 passes, a first pair of sub-magnetic poles 40 being disposed outside the main magnetic poles 38 while facing each other with an interval L2 shorter than that between the main magnetic poles 38 (i.e. L2<L1) and parallelizing a magnetic field between the main magnetic poles 38, and a second pair of sub-magnetic poles 42 being disposed inside the main magnetic poles 38 while facing each other with an interval L3 shorter than that between the main magnetic poles (i.e. L3<L1) and parallelizing the magnetic field between the main magnetic poles 38. In FIG. 9, the main magnetic poles 38 are situated behind movable magnetic poles 56.

The respective upper and lower pair of magnetic poles 38, 40 and 42 are magnetically-connected with each other collectively by a yoke 44. Further, the main magnetic poles 38, first sub-magnetic poles 40 and second sub-magnetic poles 42 are excited correctively by an exciting coil 46.

In FIG. 9, examples of the magnetic field between the magnetic poles 38, that between the first sub-magnetic poles 40 and that between the second sub-magnetic poles 42 are schematically shown by magnetic force lines 48, 50 and 52. By setting the relationships L2<L1 and L3<L1 as described above, the magnetic field between the first sub-magnetic poles 40 and that between the second sub-magnetic poles 42 which sandwiches the main magnetic poles 38 are stronger that the magnetic field between the main magnetic poles 38. For this reason, attenuation in the parallelism of the magnetic field due to swelling of the magnetic force lines 48 between the main magnetic poles 38 can be suppressed by the magnetic force lines 50, 52 on both sides so that the magnetic force lines 48 between the main magnetic poles 38 can be parallelized.

In this way, since the magnetic field 38 between the main magnetic poles can be parallelized, occurrence of the Lorentz force in a direction along the sheet face 20s of the ion beam 20 can be suppressed, thereby suppressing convergence or divergence in the width WB direction of the ion beam 20. As a result, the parallelism in the width WB direction of the sheet-shaped ion beam 20 can be enhanced, thereby further enhancing the uniformity in the width direction of the ion beam 20 of the beam current density distribution. This can be realized without increasing the width between the main magnetic poles 38 so greatly. Accordingly, enormous increase in the size and weight of the mass separating magnet 36 can be prevented.

Although the interval L2 between the first sub-magnetic poles 40 and the interval L3 between the second sub-magnetic poles 42 may be previously fixed to optimized magnitudes through computer simulation, it is preferable that at least one of the first sub-magnetic poles 40 and the second sub-magnetic poles 42 are made vertically movable as indicated by arrows H in FIG. 9. This facilitates the adjustment of parallelizing the magnetic field between the main magnetic poles 38. It is more preferable that both the first sub-magnetic poles 40 and the second sub-magnetic poles 42 are made movable so that the intervals L2 and L3 between the respective sub-magnetic poles are variable. This permits the above adjustment to be made more precisely and easily. In this case, the upper and lower pair of magnetic poles 40 or 42 may be moved in equal distances or different distances.

Although the sub-magnetic poles 40, 42 with the interval being variable may be moved manually, as in this embodiment, a sub-magnetic pole drive device 62 is preferably provided which move these sub-magnetic poles vertically as indicated by arrows H to vary the intervals L2 and L3, respectively. In this embodiment, four sub-magnetic pole drive devices are provided which drive the four sub-magnetic poles 40, 42, respectively. The use of the sub-magnetic pole drive device 62 facilitates the adjustment of parallelizing the magnetic field between the main magnetic poles. In addition, this sub-magnetic pole drive device 62 permits automated control by a control device 94 described later.

Referring to FIGS. 8 and 9, the mass separating magnet 36 includes a movable magnet pole(s) 56 disposed on at least one of inlet and outlet of the magnetic poles 38, the movable magnetic pole 56 having a semi-cylinder shape and a variable angle α, β made by a line 60 perpendicular to the traveling direction (i.e. the above center axis 20c) of the ion beam 20 and a flat end face 58 of the magnetic pole 56. In this embodiment, the movable magnetic poles 56 are provided at both inlet and outlet. Both movable magnetic poles 56 are rotatable left and right around axis 59 as indicated by arrows G, so that the above angle α, β is variable. The above angle α at the inlet and the above angle β at the outlet takes minus (−) sign when the inner periphery of the mass separating magnet 36 enters the inside and takes plus (+) sign in the opposite case. The angles α or β of upper and lower movable magnetic poles 56 may be equal or different.

Since the ion beam 20 passing the vicinity of the movable magnetic poles 56 can be converged or diverged through an edge focusing effect by adjusting the angle α, β of the movable magnetic poles 56, the divergence of the ion beam 20 due to the Coulomb repulsion acting on the width direction WB of the sheet-shaped ion beam 20 can be compensated for (or cancelled) to enhance the parallelism of the ion beam 20, thereby further enhancing the uniformity in the width WB direction of the ion beam 20 of the beam current density distribution.

The edge focusing effect itself is well known and described one g page 182 of "Physic Dictionary", first edition, by the physics dictionary editing committee, published by BAIFUUKANN Co. Ltd. in Sep. 30, 1984 (Showa 59).

The effect of enhancing the parallelism of the ion beam 20 and uniformity of the beam current density distribution can be shown by providing the movable magnetic pole(s) 56 at at least one of the inlet and outlet of the magnetic pole 38. However, as in this embodiment, if the movable magnetic poles 56 are provided at both inlet and outlet, the freedom of adjustment is higher than the case where it is provided at one side, the above effect can be further enhanced.

Even where the first sub-magnetic poles 40 and the second sub-magnetic poles 42 are not provided, the movable magnetic pole 56 may be provided. In this case, the movable magnetic poles 56 may be provided at the magnetic poles corresponding to the main magnetic poles 38 maybe provided. The remaining arrangement should be made as described above.

Although the movable magnetic poles 56 may be rotated manually, as in this embodiment, a movable magnetic pole drive device 66 is preferably provided which rotates the movable magnetic pole 56 left and right as indicated by arrow G to vary the angle α, β. In this embodiment, four movable magnetic pole drive devices are provided which rotate the upper and lower movable magnetic poles 56 at the inlet of the main magnetic poles 38 and the upper and lower movable magnetic poles 56 of the outlet thereof. The use of the movable magnetic pole drive device 66 facilitates the adjustment of the angle α, β of the movable magnetic pole 56.

In addition, this movable magnetic pole drive device 66 permits automated control by the control device 94 described later.

Incidentally, as the vacuum sealing structure for the sub-magnetic poles 40, 42 with the valuable intervals and the shaft 59 for the movable magnetic pole 56 in the mass separating magnet 36, concretely the vacuum sealing structure between these magnetic poles and the yoke 44, in this embodiment, a known structure (e.g. structure using the packing for vacuum sealing) is adopted and hence not shown in FIG. 9.

As shown in FIGS. 2 and 4, a pair of scanning electrodes 74 may be disposed at a downstream side of the separating slit 72 and facing each other while sandwiching the whole sheet face 20s of the sheet-shaped ion beam 20 and reciprocatedly scanning the whole sheet-shaped ion beam 20 in a direction perpendicular to the sheet face 20s. In this embodiment, the scanning electrodes 74 are a pair of plate electrodes in parallel, but should not be limited to them. For example, the scanning electrodes 74 may be electrodes which slightly extend toward the downstream side.

A vibration voltage from a scanning power supply 76 is applied between the pair of scanning electrodes 74. The vibration voltage may be e.g. an A.C. voltage. However, the A.C. voltage should not be limited to the voltage having a zero average value over one period.

The scanning electrodes 74 and the scanning power supply 76 permit the whole ion beam 20 to be scanned in the direction perpendicular to it sheet face 20s. This increases the thickness TB of the ion beam 20 (which is also the width in the reciprocated driving direction D of the substrate) which has become very small after the ion beam had passed through the separating slit 72. Where the thickness TB of the ion beam 20 is very small, there is possibility of producing non-uniformity in the implanting quantity due to fluctuation of the reciprocated driving speed of the substrate 82 and the current value of the ion beam 20. This non-uniformity can be alleviated by increasing the thickness TB of the ion beam 20.

As shown in FIGS. 2 and 4, a beam profile monitor 90 may be disposed in the vicinity of the upstream side or downstream side of the substrate 82 on the holder 84 and measuring the beam current density distribution in the width WB direction by receiving the sheet-shaped ion beam 20. The beam profile monitor 90 is located preferably near to the substrate 82 on the holder 84. In this way, the beam current density distribution of the ion beam 20 at the position of the substrate 82 can be measured more accurately. The beam profile monitor 90 produces measurement information DP representative of the beam current density distribution.

If the beam profile monitor 90 is located at the downstream side of the substrate 82 as in this embodiment, it is not required to be moved because it does not hinder the projection of the ion beam 20 onto the substrate 82. However, the beam profile monitor 90 may be located in the vicinity of the upstream side of the substrate 82 so that it is moved during the projection of the ion beam 20 onto the substrate 82.

In this embodiment, the beam profile monitor 90 has a plurality of (e.g. 29) Faraday cups arranged in the width WB direction of the sheet-shaped ion beam 20 over the region wider than the width WB. In this embodiment, therefore, the above measurement information DP consists of n6 (n6 is equal to the number of the Faraday cups 92) items of measurement information. The lateral width of each Faraday cup 92 is made larger than e.g. the thickness TB of the ion beam 20 incident on the beam profile monitor 90. However, in place of such a beam profile monitor 90, the beam profile monitor having a structure moving a single Faraday cup in the width WB direction of the ion beam 20 maybe provided. In either case, the beam current density distribution in the width WB direction of the ion beam 20 can be measured.

Provision of the beam profile monitor 90, which permits the measurement information DP obtained to be used, facilitates the adjustment of enhancing the uniformity of the beam current density distribution and parallelism in the width WB direction of the sheet-shaped ion beam 20.

The method for enhancing the uniformity of the beam current density distribution and parallelism in the width WB direction of the sheet-shaped ion beam 20 on the basis of the measurement information DP acquired by the beam profile monitor 90 includes two techniques of (1) manually adjusting object devices on the basis of the measurement information DP, and (2) automatically controlling the object device using the control device 94 (see FIG. 2) which is previously provided and acquires the measurement information DP. The object devices include e.g. the filament power supply 8, electrostatic lens direct current power supply 32, magnetic lens direct current power supply 110, sub-magnetic poles 40, 42 and movable magnetic poles 56. Where the sub-magnetic pole drive device 62 and the movable magnetic pole drive device 66 are provided, they are included in the object devices. In the case of the automated control, the sub-magnetic poles 40, 42 and movable magnetic poles 56 are not directly controlled, but the drive devices 62, 66 prepared therefor are controlled.

The manual adjustment will be briefly explained below. With an initial value being given to each of the object devices, the ion beam 20 extracted from the ion source 2 is received by the beam profile monitor 90 to measure the beam current density distribution. If the measurement result is away from a target value, the status of one of above object devices is altered by a prescribed value in a predetermined direction. In this status, the beam current density distribution is measured again. If the measurement result has approached the target value, the above adjustment of alternation is continued. If the measurement result has left the target value, the status is changed by the prescribed value in a direction opposite to the above direction. Such an adjustment for each step may be repeated until the beam current density distribution measured by the beam profile monitor 90 reaches the target value or approaches the target value to a certain extent. If a satisfactory result cannot be obtained by adjustment for the one object device, the same adjustment may be performed for another object device.

In this embodiment, although the above control device 94 can perform the following items of control (a) to (e), it is not required to perform all the items of control but has only to perform at least one of the items of control. Further, in place of using a single control device 94, the items of control (a) to (e) may be shared by a plurality of control devices. For example, the plurality of control devices may be provided for performing the items of control (a) to (e).

(a) The control device 94 controls the filament power supply 8 on the basis of the measurement information DP acquired by the beam profile monitor 90 in such a manner that if there is a region with a lower current density than that of other regions, the current to be passed through the filament 6 corresponding to the lower current density region 6 is increased; in an opposite case, the opposite operation is performed (i.e. the filament current is decreased), thereby performing the control of uniformizing the beam current density distribution in the width WB direction of the sheet-shaped ion beam 20 incident on the substrate 82.

More specifically, since the corresponding positional relationship between each Faraday cup 92 of the beam profile monitor 90 and each filament 6 of the ion source 2 is previously determined, the control device 94 can determine the filament 6 corresponding to the above the lower current density region. If the lower current density region corresponds to the m-th filament (m represents any number; the same goes for the following description), the control device 94 increases or decreases the filament current to be passed through the m-th filament 6. Such a control is repeated until the prescribed beam current density distribution is obtained.

In order to perform the above control, the control device 94 produces n1 control signals S1 (n1 is equal to the number of the filaments 6) and gives these signals to the filament power supplies 8 to be controlled, respectively.

In the way described above, the beam profile monitor 90 and control device 94 feed-back control the filament currents from the ion source 2 to enhance, by automated control, the uniformity of the beam current density distribution in the width WB direction of the sheet-shaped ion beam 20 incident on the substrate 82.

(b) The control device 94 controls the electrostatic lens direct current power supply 32 on the basis of the measurement information DP acquired by the beam profile monitor 90 in such a manner that if there is a region with a lower current density than that of other regions, the voltage applied to the pair of electrodes corresponding to the lower current density region 6 is decreased so that the electric field E is oriented from the adjacent regions toward the region in the electrostatic lens 24 corresponding to the lower current density region (see FIG. 7); in an opposite case, the opposite operation is performed (i.e. the voltage is increased to decrease the electrode field or orient it in an opposite direction), thereby performing the control of uniformizing the beam current density distribution in the width WB direction of the sheet-shaped ion beam 20 incident on the substrate 82.

More specifically, since the corresponding positional relationship between each Faraday cup 92 of the beam profile monitor 90 and each pair of electrodes of the electrostatic lens 24 is previously determined, the control device 94 can determine the pair of electrodes corresponding to the above the lower current density region. If the lower current density region corresponds to e.g. the m-th pair of electrodes from above in the Y direction, the control device 94 increases or decreases the value to be applied to the m-th pair of electrodes. Such a control is repeated until the prescribed beam current density distribution is obtained. Also when the lower current density region is located between the pairs of electrodes, the same operation is also performed.

The voltage applied to the pairs of electrodes on both sides(i.e. (m−1)-th and (m+1)-th) of the m-th pair of electrodes may be also increased or decreased in a prescribed relationship with the m-th pair of electrodes.

In order to perform the above control, the control device 94 produces n2 control signals S2 (n2 is equal to the number of the pairs of electrodes) and gives these signals to the electrostatic lens direct current power supplies to be controlled, respectively.

In the way described above, the beam profile monitor 90 and control device 94 feed-back control the electrostatic lens 24 to enhance, by automated control, the uniformity of the beam current density distribution in the width WB direction of the sheet-shaped ion beam 20 incident on the substrate 82.

(c) The control device 94 controls the magnetic lens direct current power supply 110 on the basis of the measurement information DP acquired by the beam profile monitor 90 in such a manner that if there is a region with a lower current density than that of other regions, the current to be passed through the excitation coil 104 of the pair of magnetic poles corresponding to the lower current density region 6 is adjusted so that the Lorentz force is increased from the adjacent regions toward the region in the magnetic lens 100 corresponding to the lower current density region (see FIG. 11); in an opposite case, the opposite operation is performed (i.e. the Lorentz force is decreased or oriented in an opposite direction), thereby performing the control of uniformizing the beam current density distribution in the width WB direction of the sheet-shaped ion beam 20 incident on the substrate 82.

More specifically, since the corresponding positional relationship between each Faraday cup 92 of the beam profile monitor 90 and each pair of magnetic poles of the magnetic lens 100 is previously determined, the control device 94 can determine the pair of magnetic poles corresponding to the above lower current density region. If the lower current density region corresponds to e.g. the m-th pair of magnetic poles from above in the Y direction, the control device 94 increases the current to be passed through the excitation coil 104 of the (m−1)-th pair of electrodes (in the case of the direction of the magnetic field B in FIG. 11), thereby increasing the Lorentz force F toward the lower current density region. In this case, simultaneously, the polarity of the (m+1)-th magnetic lens direct current power supply 110 may be inverted to invert the magnetic field B generated by the (m+1)-th pair of magnetic poles, thereby increasing the Lorentz force F from the (m+1)-th pair of magnetic poles toward the lower current density region. Such a control is repeated until the prescribed beam current density distribution is obtained. Also when the lower current density region is located between the pairs of magnetic poles, the same operation is also performed.

The current to be passed through the pairs of magnetic poles on both sides(i.e. (m−2)-th and (m+2)-th) of the (m−1)-th and (m+1)-th pairs of electrodes may be also adjusted in the above described manner in a prescribed relationship with the current to be passed through the (m−1)-th and (m+1)-th pairs of magnetic poles.

In order to perform the above control, the control device 94 produces n3 control signals S3 (n3 is equal to the number of the pairs of magnetic poles)and gives these signals to the magnetic lens direct current power supplies 110 to be controlled, respectively.

In the way described above, the beam profile monitor 90 and control device 94 feed-back control the magnetic lens 100 to enhance, by automated control, the uniformity of the beam current density distribution in the width WB direction of the sheet-shaped ion beam 20 incident on the substrate 82.

(d) The control device 94 controls the sub-magnetic pole drive device(s) 62 on the basis of the measurement information DP acquired by the beam profile monitor 90 in such a manner that if the beam current density distribution is more divergent than a predetermined target value, the respective intervals L2, L3 between the sub-magnetic poles 40, 42 with the intervals L2, 13 being variable are changed in a direction of converging the ion beam 20 derived from the mass separating magnet 36 within a plane in parallel to the sheet face 20s thereof; in an opposite case, the opposite operation is performed (i.e. the intervals L2, L3 are changed in a direction of diverging the ion beam 20), thereby performing the control of enhancing the parallelism in the width WB direction of the sheet-shaped ion beam 20 incident on the substrate 82.

More specifically, if the beam current density distribution is too divergent from the target value, the control device 94 increases the interval L2 between the first sub-magnetic poles 40 on the outer periphery and decreases the interval L3 between the second sub-magnetic poles 42 on the inner periphery. If the beam current density distribution is too convergent from the target value, the control device 94 perform an opposite operation.

In order to perform the above control, the control device 94 produces n4 control signals S4 (n4 is equal to the number of the sub-magnetic pole drive devices 62) and gives these signals to the sub-magnetic pole drive devices to be controlled, respectively.

In the way described above, the beam profile monitor 90 and control device 94 feed-back control the intervals L2, L3 between the sub-magnetic poles 40, 42 of the mass separating magnet 36 to enhance, by automated control, the uniformity of the beam current density distribution in the width WB direction of the sheet-shaped ion beam 20 incident on the substrate 82.

(e) The control device 94 controls the movable magnetic pole drive device(s) 66 on the basis of the measurement information DP acquired by the beam profile monitor 90 in such a manner that if the beam current density distribution is more divergent than a predetermined target value, the movable magnetic pole(s) is rotated in a direction of converging the ion beam 20 derived from the mass separating magnet 36 within a plane in parallel to the sheet face 20s thereof; in an opposite case, the opposite operation is performed (i.e. the movable magnetic pole(s) 56 is rotated in a direction of diverging the ion beam 20), thereby performing the control of enhancing the parallelism in the width WB direction of the sheet-shaped ion beam 20 incident on the substrate 82.

More specifically, if the beam current density distribution is too divergent from the target value, the angle $\alpha$, $\beta$ is oriented in a plus direction. If the beam current density distribution is too convergent from the target value, the angle $\alpha$, $\beta$ is oriented in a minus direction.

In order to perform the above control, the control device 94 produces n5 control signals S4 (n5 is equal to the number of the movable magnetic pole drive device(s) 66) and gives these signals to the movable magnetic pole drive device(s) 66 to be controlled, respectively.

In the way described above, the beam profile monitor 90 and control device 94 feed-back control the angle α, β of the movable magnetic pole 56 to enhance, by automated control, the uniformity of the beam current density distribution in the width WB direction of the sheet-shaped ion beam 20 incident on the substrate 82.

What is claimed is:

1. An ion implanting apparatus for transporting and projecting, an ion beam which has been produced by an ion source and is shaped into a sheet with a width longer than a narrow side width of a substrate, while keeping the width relationship, the apparatus comprising:
    the ion source for producing the ion beam including desired ion species to be implanted into the substrate and being shaped into the sheet with the width relationship, the ion source having a plurality of filaments which are used for generating a plasma for the sheet-shaped ion beam and arranged in a width direction of the sheet-shaped ion beam;
    one or more filament power supplies capable of controlling filament currents flowing through the respective filaments of the ion source, independently of one another;
    a mass separating magnet for receiving the sheet-shaped ion beam generated by the ion source, and selectively deriving the desired ion species by bending the ion beam in a direction perpendicular to a sheet face thereof, the mass separating magnet having magnet poles which are disposed with an interval longer than the width of the ion beam;
    a separating slit for receiving the sheet-shaped ion beam which has been derived from the mass separating magnet and selectively making the desired ion species pass through by cooperating with the mass separating magnet;
    a substrate drive device having a holder for holding the substrate, and reciprocatedly driving the substrate on the holder in a direction intersecting with the sheet face of the ion beam within an irradiating area of the sheet-shaped ion beam which has passed through the separating slit;
    a lens for uniformizing a beam current density distribution in the width direction of the sheet-shaped ion beam; and
    a beam profile monitor being disposed at an upstream side or downstream side of the substrate on the holder and measuring the beam current density distribution in the width direction by receiving the sheet-shaped ion beam.

2. The ion implanting apparatus according to claim 1, wherein the lens comprises an electrostatic lens having a plurality of pairs of electrodes arranged in a direction along the sheet face and perpendicular to a beam traveling direction, the pair of electrodes being disposed between the ion source and the mass separating magnet or between the mass separating magnet and the separating slit and facing each other while sandwiching the sheet face of the sheet-shaped ion beam, and wherein the lens uniformizes the beam by bending the ion present in a predetermined area of the sheet-shaped ion beam in the direction along the sheet face of the ion beam and perpendicular to the beam traveling direction; and
    one or more electrostatic lens direct current power supplies for applying direct currents which are independent from each other between the respective pairs of electrodes of the electrostatic lens and a reference potential portion.

3. The ion implanting apparatus according to claim 2, further comprising:
    an electrostatic lens vibration power supply, in place of the electrostatic lens direct current power supply or in addition to the electrostatic lens direct current power supply, controlling a beam emittance in the direction along the sheet face of the sheet-shaped ion beam and perpendicular to the beam traveling direction by applying a vibration voltage between the odd numbers' pair of electrodes and the even numbers' pair of electrodes of the electromagnetic lens to vibrate the electric field intensity in the electrostatic lens periodically.

4. The ion implanting apparatus according to claim 1, wherein the lens comprises a magnetic lens having a plurality of pairs of magnetic poles arranged in a direction along the sheet face and perpendicular to the beam traveling direction and a plurality of excitation coils for exciting the respective pairs of magnetic poles, the pair of magnetic pole being disposed between the ion source and the mass separating magnet or between the mass separating magnet and the separating slit and facing each other while sandwiching the sheet face of the sheet-shaped ion beam, and wherein the uniformizes the beam by bending the ion present in the predetermined area of the sheet-shaped ion beam in the direction along the sheet face of the ion beam and perpendicular to the beam traveling direction; and
    a plurality of magnetic lens direct current power supplies for flowing direct currents through the respective excitation coils of the magnetic lens.

5. The ion implanting apparatus according to claim 4, further comprising:
    a plurality of magnetic lens vibration power supplies, in place of the magnetic lens direct current power supply or in addition to the magnetic lens direct current power supply, the magnetic lens vibration power supply controlling a beam emittance in the direction along the sheet face of the sheet-shaped ion beam and perpendicular to the beam traveling direction by passing vibration currents through the respective excitation coils of the magnetic lens to vibrate a magnetic field intensity in the magnetic lens periodically.

6. The ion implanting apparatus according to claim 1, wherein the mass separating magnet includes a pair of main magnetic poles facing with an interval longer than the width of the sheet-shaped ion beam, through which the sheet-shaped ion beam pass, a first pair of sub-magnetic poles being disposed outside the main magnetic pole which facing with an interval shorter than that of the main magnetic poles and parallelizing a magnetic field between the main magnet poles, a second pair of sub-magnetic poles being disposed inside the main magnetic poles while facing with an interval shorter than that of the main magnetic poles and parallelizing the magnetic field between the main magnetic poles, and an excitation coil for exciting the main magnetic poles, the first sub-magnetic poles and the second sub-magnetic poles.

7. The ion implanting apparatus according to claim 6, wherein the interval of at least one of the first sub-magnetic poles and the second sub-magnetic poles is variable.

8. The ion implanting apparatus according to claim 7, further comprising:
    a sub-magnetic pole drive device for varying the interval of the variable sub-magnetic poles by moving them.

9. The ion implanting apparatus according to claim 1, wherein the mass separating magnet includes a movable magnetic pole disposed on at least one of inlet and outlet of the magnetic poles, the movable magnetic pole having a semi-cylinder shape and a variable angle made by a line perpendicular to the ion beam traveling direction and an end face of the magnetic pole.

10. The ion implanting apparatus according to claim 6, wherein the mass separating magnet includes a movable magnetic pole disposed on at least one of inlet and outlet of the main magnetic poles, the movable magnetic pole having a semi-cylinder shape and a variable angle made by a line perpendicular to the ion beam traveling direction and an end face of the magnetic pole.

11. The ion implanting apparatus according to claim 9, further comprising:
a movable magnetic pole drive device for varying the angle by rotating the movable magnetic pole.

12. The ion implanting apparatus according to claim 1, further comprising:
a pair of scanning electrodes being disposed at a downstream side of the separating sift and facing each other while sandwiching the whole sheet face of the sheet-shaped ion beam and reciprocatedly scanning the whole sheet-shaped ion beam in a direction perpendicular to the sheet face; and
a scanning power supply for applying a vibration voltage between the pair of scanning electrodes.

13. The ion implanting apparatus according to claim 1, further comprising:
a beam profile monitor being disposed at an upstream side or downstream side of the substrate on the holder and measuring the beam current density distribution in the width direction by receiving the sheet-shaped ion beam.

14. The ion implanting apparatus according to claim 1, further comprising:
a controller for uniformizing the beam current density distribution in the width direction of the sheet-shaped ion beam to be incident on the substrate by controlling the filament power supply based on the measuring information of the beam profile monitor so that the filament current flowing through the filament corresponding to a low current density area increases if there is the low current density area in which the beam current density is lower than other areas, and in an opposite case, the opposite operation is performed.

15. The ion implanting apparatus according to claim 2, further comprising:
a controller for uniformizing the beam current density distribution in the width direction of the sheet-shaped ion beam to be incident on the substrate by controlling the electrostatic lens direct current power supply based on the measuring information of the beam profile monitor to decrease the voltage to be applied into the pair of electrodes corresponding to a low current density area so that the electrostatic field is directed to an area in the electrostatic lens corresponding to the low current density area from the next thereto if there is the low current density area in which the beam current density is lower than other areas, and in an opposite case, the opposite operation is performed.

16. The ion implanting apparatus according to claim 4, further comprising:
a controller for uniformizing the beam current density distribution in the width direction of the sheet-shaped ion beam to be incident on the substrate by controlling the magnetic lens direct current power supply based on the measuring information of the beam profile monitor to adjust the current to be passed through the excitation coil of the pair of magnetic poles in the vicinity of an area corresponding to a low current density area so that the Lorenz force directed to an area in the magnetic lens corresponding to the low current density are from the next thereto increases if there is the low current density in which the beam current density is lower than other areas, and in an opposite case, the opposite operation is performed.

17. The ion implanting apparatus according to claim 8, further comprising:
a controller for enhancing the parallelism in the width direction of the sheet-shaped ion beam to be incident on the substrate by controlling the sub-magnetic pole drive device based on the measuring information of the beam profile monitor so that the interval of the movable sub-magnetic pole is varied in a direction in which the ion beam derived from the mass separating magnet is converged within a plane parallel to the sheet face if the beam current density distribution is diverged more than the predetermined target value, and in an opposite case, the opposite operation is performed.

18. The ion implanting apparatus according to claim 11, further comprising:
a controller for enhancing the parallelism in the width direction of the sheet-shaped ion beam to be incident on the substrate by controlling the movable magnetic pole drive device based on the measuring information of the beam profile monitor so that the movable magnetic pole is rotated in a direction in which the ion beam derived from the mass separating magnet is converged within a plane parallel to the sheet face if the beam current density distribution is diverged more than the predetermined target value, and in an opposite case, the opposite operation is performed.

* * * * *